(12) United States Patent
Futatsuyama et al.

(10) Patent No.: US 7,700,997 B2
(45) Date of Patent: Apr. 20, 2010

(54) SEMICONDUCTOR MEMORY DEVICE

(75) Inventors: Takuya Futatsuyama, Yokohama (JP);
Toshiya Kotani, Machida (JP);
Hiromitsu Mashita, Sagamihara (JP);
Atsushi Maesono, Yokohama (JP);
Ayako Nakano, Yokohama (JP);
Tadahito Fujisawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 11/346,293

(22) Filed: Feb. 3, 2006

(65) Prior Publication Data
US 2006/0197136 A1 Sep. 7, 2006

(30) Foreign Application Priority Data

Feb. 3, 2005 (JP) ............................. 2005-027718
Dec. 9, 2005 (JP) ............................. 2005-356796

(51) Int. Cl.
*G11C 16/04* (2006.01)
(52) U.S. Cl. ...................................... 257/326; 257/314
(58) Field of Classification Search ................. 257/314, 257/326, E27.102
See application file for complete search history.

(56) References Cited

U.S. PATENT DOCUMENTS

| | | | | |
|---|---|---|---|---|
| 5,378,907 A | * | 1/1995 | Melzner ...................... | 257/301 |
| 5,459,694 A | * | 10/1995 | Arakawa ............... | 365/185.21 |
| 5,844,840 A | * | 12/1998 | Le et al. ................. | 365/185.23 |
| 6,504,763 B1 | * | 1/2003 | Yang et al. ............. | 365/185.28 |
| 6,531,357 B2 | | 3/2003 | Takeuchi et al. | |
| 6,596,578 B2 | | 7/2003 | Takeuchi et al. | |
| 6,649,945 B1 | | 11/2003 | Hosono et al. | |
| 6,839,283 B1 | * | 1/2005 | Futatsuyama et al. .. | 365/185.23 |
| 6,927,990 B2 | | 8/2005 | Mukai | |
| 2004/0057266 A1 | * | 3/2004 | Mukai ......................... | 365/45 |
| 2005/0058011 A1 | | 3/2005 | Futatsuyama et al. | |

FOREIGN PATENT DOCUMENTS

| | | |
|---|---|---|
| JP | 2002-64043 | 2/2002 |
| JP | 2004-55617 | 2/2004 |
| JP | 2004-79857 | 3/2004 |

OTHER PUBLICATIONS

U.S. Appl. No. 11/851,078, filed Sep. 6, 2007, Sakuma, et al.
U.S. Appl. No. 12/169,270, filed Jul. 8, 2008, Yanagidaira, et al.

* cited by examiner

*Primary Examiner*—Thomas L Dickey
(74) *Attorney, Agent, or Firm*—Oblon, Spivak, McClelland, Maier & Neustadt, L.L.P.

(57) ABSTRACT

According to this invention, the NAND type flash memory of high reliability is realized. It provides a semiconductor memory device comprising: a plurality of memory cells; a plurality of word lines formed by a first gate wiring layer; a plurality of first transistors for providing voltages to said word lines; and electrical connections for connection said word lines and sources or drains of said first transistors, said electrical connections being formed of both first wirings of a first wiring layer formed above said first gate wiring layer and second wirings of a second wiring layers formed above said first wiring layer.

9 Claims, 20 Drawing Sheets

FIG.13
Etching conversion difference of line end
(a)
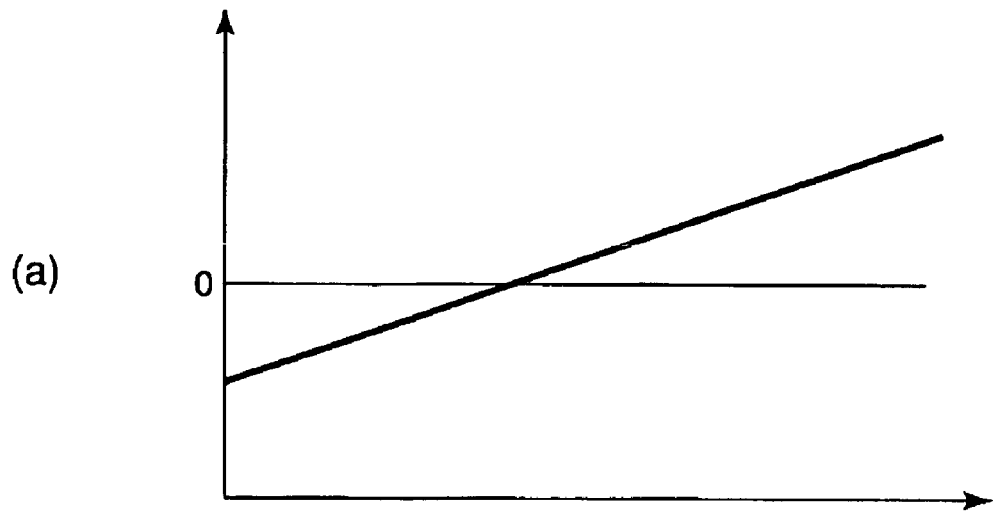
Distance S from end of concentrated pattern to countering pattern
Etching conversion difference of line tip end
(b)
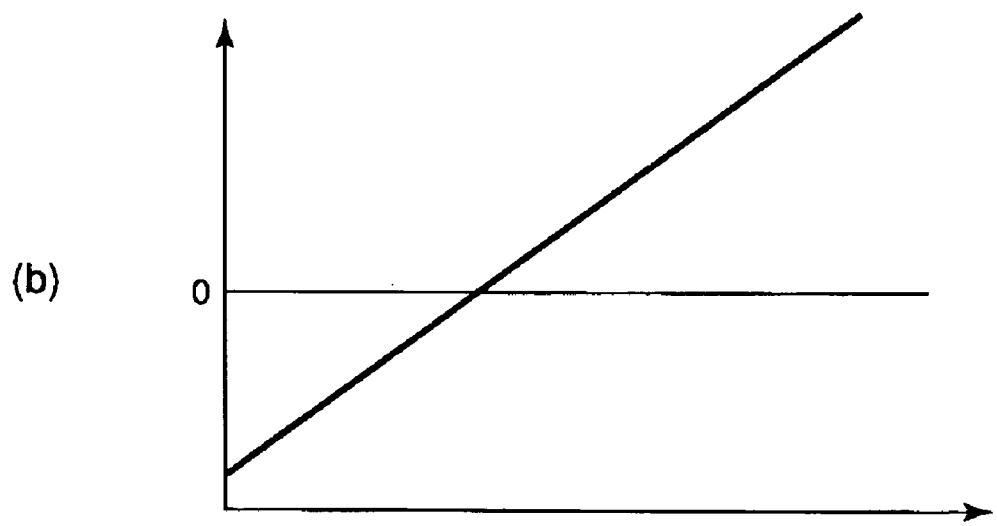
Distance S from end of concentrated pattern to countering pattern

FIG.14
Resist size of line end
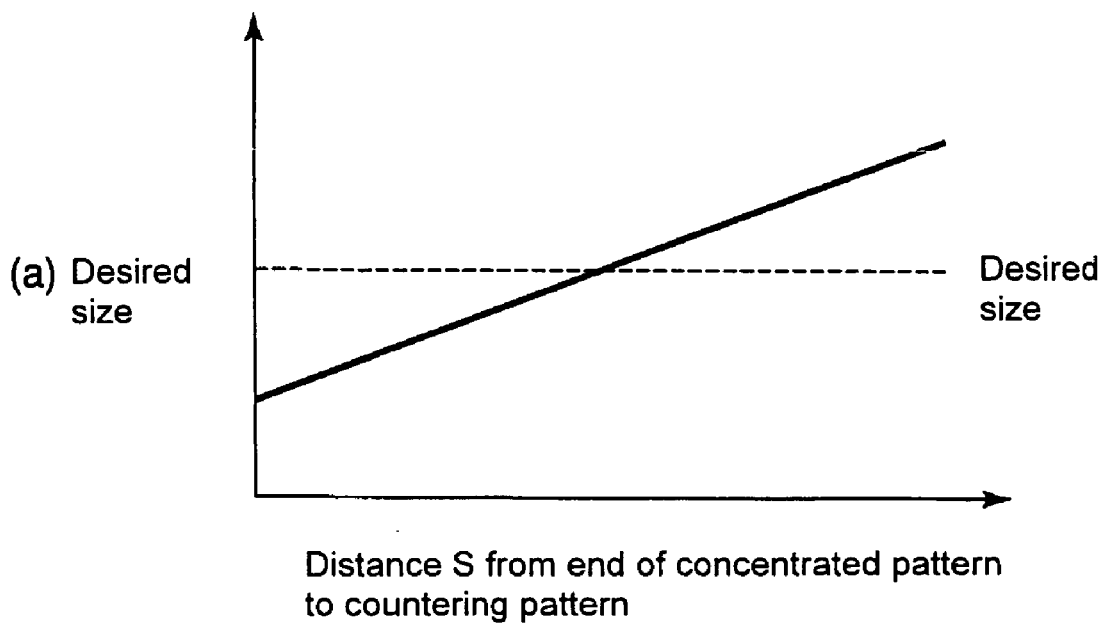
(a) Desired size ---- Desired size
Distance S from end of concentrated pattern to countering pattern
Shortening amount of line tip part (resist)
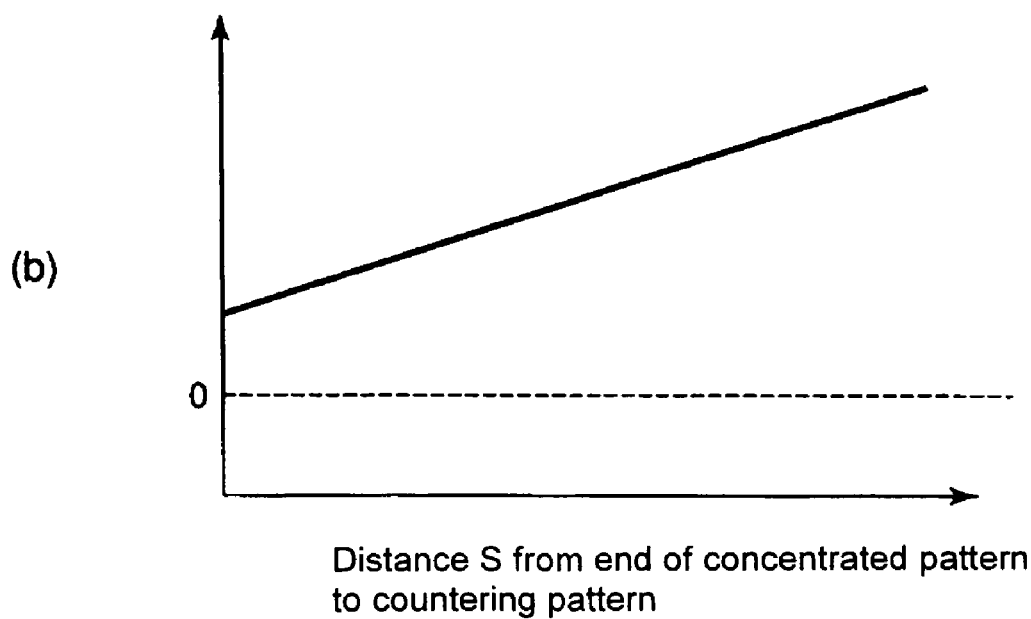
(b)
Distance S from end of concentrated pattern to countering pattern FIG. 15
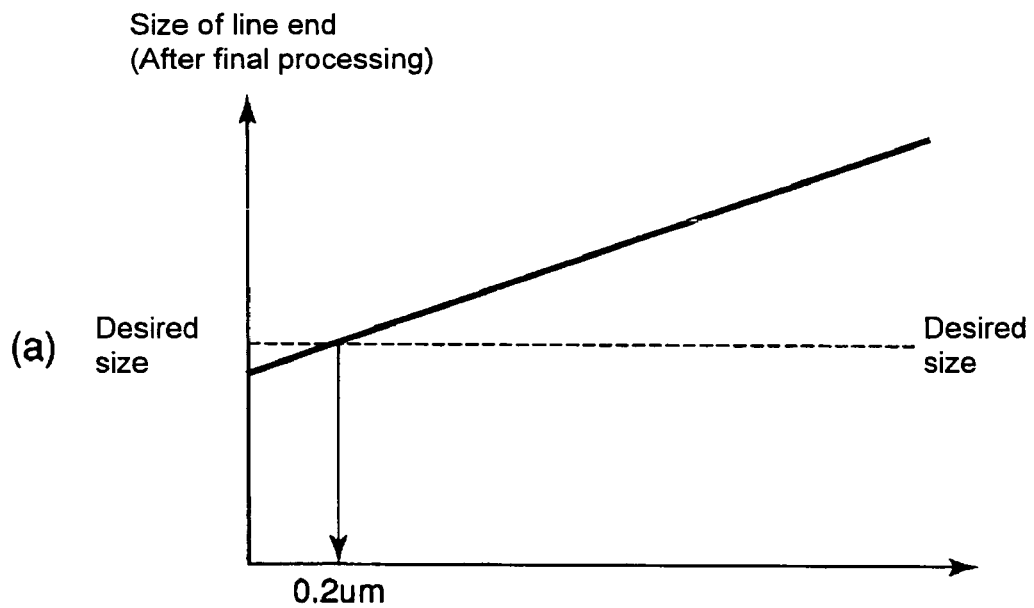
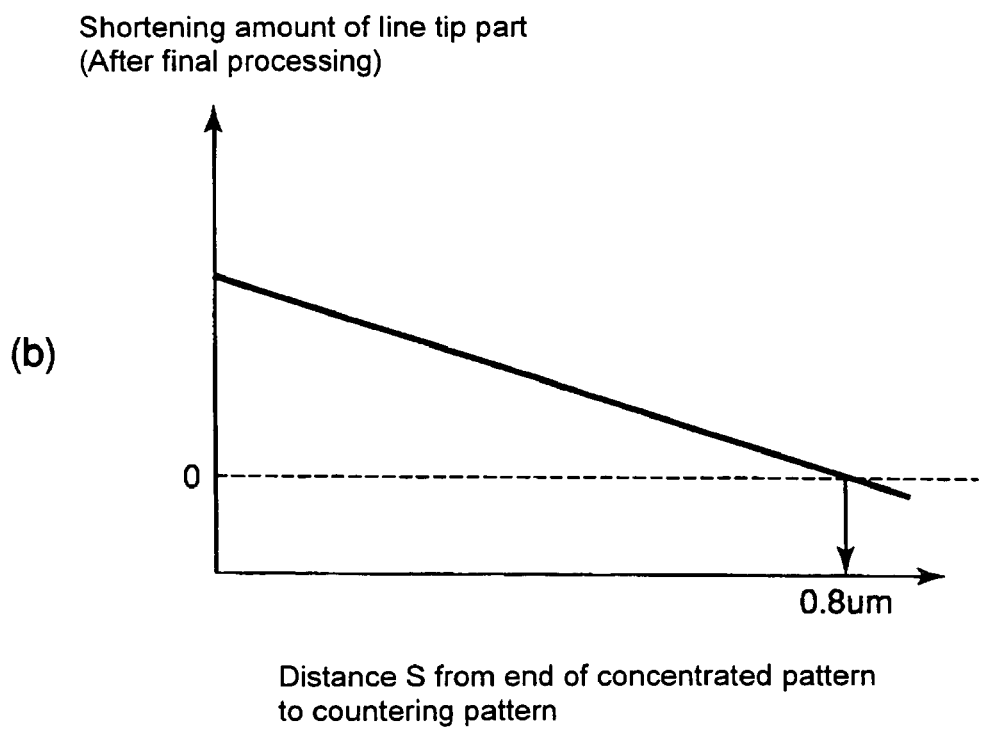

SEMICONDUCTOR MEMORY DEVICE

CROSS-REFERENCE TO RELATED APPLICATIONS

This application is based upon and claims the benefit of priority from the prior Japanese Patent Applications No. 2005-27718, filed on Feb. 3, 2005 and No. 2005-356796, filed on Dec. 9, 2005, the entire contents of which are incorporated herein by reference.

TECHNICAL FIELD

This invention relates to an electrically reprogrammable semiconductor memory device. In particular this invention relates to layout arrangement technologies of wirings in non-volatile semiconductor memory devices which are one kind of semiconductor memory device.

BACKGROUND OF THE INVENTION

The demand for non-volatile semiconductor memory devices, which are small in size and large scale in capacity, has increased rapidly in recent years. Compared with NOR type flash memories, NAND type flash memories, which can expect higher integration and larger memory capacity, have attracted attention.

Widths and intervals (Line and Space) of wirings in non-volatile semiconductor memory devices, such as a NAND type flash memory, become small as ultra-fine processing technologies of photolithography advance (scaling is carried out). Generally, the size of NAND strings becomes smaller in accordance with the advance in its feature size (chip process generations). As a result, large capacity NAND type flash memories are realizable. When the sizes of NAND strings become small, it will be necessary to make the size of transfer transistors smaller. However, when the size of transfer transistors become small, the Line and Space of a gate wiring GC and a first wiring layer M0 which connect the word line WL connected to the NAND string and transfer transistors, cannot be fully secured. As a result, the withstanding voltage between word lines WL will also decrease. It becomes difficult to avoid defects, such as short-circuiting of word lines by dielectric breakdown, and it becomes difficult to maintain the reliability of NAND type flash memories. While Japanese Patent Publications (Kokai) 2004-79857, 2004-55617 describe the above NAND type flash memory dealing with such problems, these publications are hereby incorporated as references.

BRIEF SUMMARY OF THE INVENTION

In this invention, the wiring widths and the intervals (Line and Space) of wirings are broader for the wiring layer in which a high withstanding voltage is required. Moreover, a wiring layout is arranged so that the potential difference between wirings becomes small. As a result, semiconductor memory devices, such as NAND type flash memories which are highly reliable and highly integrated, are obtained.

According to one embodiment of this invention, it is provided A NAND type flash memory device comprising: a plurality of memory cells; a plurality of word lines formed by a first gate wiring layer; a plurality of first transistors for providing voltages to said word lines; and electrical connections for connection of said word lines to sources or drains of said first transistors, said electrical connections being formed of both first wirings of a first wiring layer formed above said first gate wiring layer and second wirings of a second wiring layers formed above said first wiring layer.

According to one embodiment of this invention, it is provided A non-volatile semiconductor memory device comprising: a plurality of memory cells; a plurality of select gates and word lines formed by a first gate wiring layer; a plurality of first transistors for providing voltages to said select gates and word lines; and electrical connections for connection of said select gates and word lines to sources or drains of said first transistors, said electrical connections being formed of both first wirings of a first wiring layer formed above said first gate wiring layer and second wirings of a second wiring layers formed above said first wiring layer, a first voltage difference between adjacent ones of said select gates and word lines formed by said first gate wiring layer is not greater than a program voltage; a second voltage difference between adjacent ones of said first wirings formed by said first wiring layer is not greater than said program voltage or a first voltage for transferring said program voltage to said memory cells by said first transistors; and a third voltage difference between adjacent ones of said second wirings formed by said second wiring layer is not greater than said program voltage or an erase voltage.

According to one embodiment of this invention, it is provided a semiconductor memory comprising: a plurality of memory cells; a plurality of word lines formed by a first gate wiring layer; a plurality of bit lines connected to said plurality of memory cells, said bit lines being formed by both of a first wiring layer formed above said first gate wiring layer and a second wiring layer formed above said first wiring layer, a portion of said bit lines formed by said second wiring layer is of a pattern of a group of substantially straight lines arranged in parallel.

According to one embodiment of the semiconductor memory device of this invention, whereby the wiring layer is required to withstand a high voltage, the wiring widths and wiring intervals are broadened, making manufacturing easier. As a result, a high yield is realizable, while high integration is achieved. Moreover, according to the semiconductor memory device of one embodiment of this invention, potential differences between wirings can be made smaller and the semiconductor memory device with high reliability can be realized.

BRIEF DESCRIPTION OF THE DRAWINGS

FIG. 13 is a figure showing the relation of Distance S (distance between a line tip part and the pattern which counters) and the etching conversion difference of a line end and a tip part in one embodiment of this invention.

FIG. 14 is a figure showing a relation with Distance S (distance of a line tip part and the pattern which counters), the photo-resist size (the line end and the tip part), and the amount of shortenings in one embodiment of this invention.

FIG. 15 is a figure showing a relation with Distance S (distance of a line tip part and the pattern which counters), the photo-resist size (the line end and the tip part), and the amount of shortenings in one embodiment of this invention.

DETAILED DESCRIPTION OF THE INVENTIONS

Figure 1:
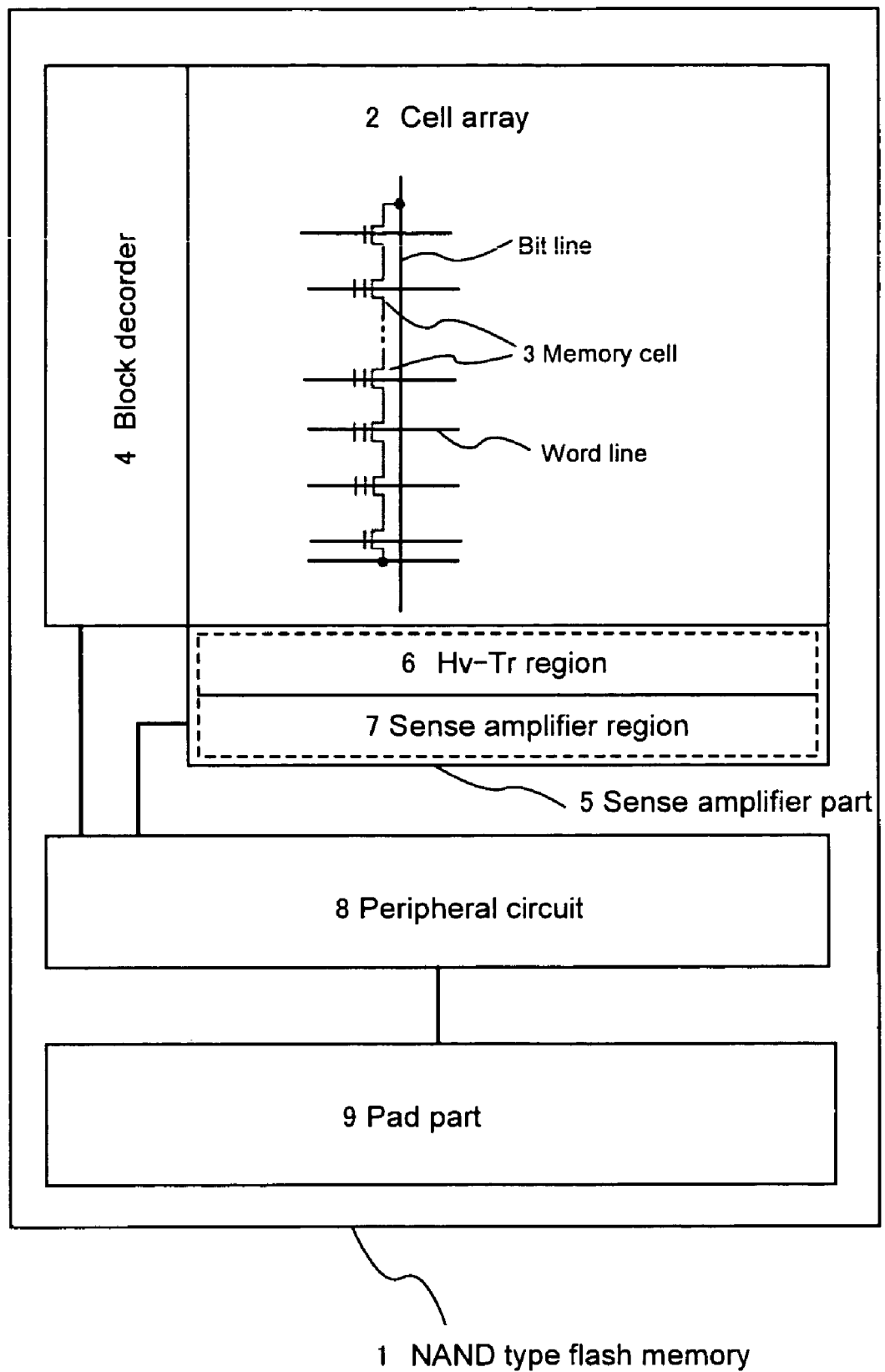
FIG. 1 is an outline block diagram of the NAND type flash memory concerning one embodiment of this invention.

Generally, in non-volatile semiconductor memory devices, such as NAND type flash memories, large scale and high reliability are required. In order to realize high reliability of nonvolatile memories, such as NAND type flash memories, the withstanding voltages of tunnel oxide films are required to be high. Therefore, it is difficult to make tunnel oxide films thin. Alternatively, it is also difficult to reduce program voltage levels in nonvolatile memories. In order to realize large capacity NAND type flash memories, it is necessary to advance chip-shrink. However, in the situation above, scaling of high-voltage transistors which receive high voltages, such as program voltage is difficult. However, the widths and the intervals of wirings become smaller as ultra-fine processing technology progresses. As a result, high voltages are applied to the insulating film arranged between narrow and thin wiring layers as the scaling progresses.

Alternatively, a low temperature process is desirable after gate wiring formation of transistors because of restrictions of the process of nonvolatile semiconductor memory devices. It is because high temperature heat processes deteriorate the impurity profile of junctions and the channels of transistors.

In general, metals with a lower melting point are used for the upper-layer wirings in the semiconductor memory process. Therefore, in the upper-layer wiring, the insulating film between wiring layers will be formed at a lower temperature, and its voltage tolerance deteriorates.

Generally, in nonvolatile semiconductor memory devices, word lines and bit lines of a memory cell array are connected to respective ones in memory cells. In the area where these word lines and bit lines are extended to peripheral circuits, the problems above appear. The reason is as follows. In memory cells, word lines and bit lines are formed with the minimum feature size of the process. Wiring widths and spaces are broader and extended in the area (peripheral circuits) in which word lines and bit lines are extended. In this area (peripheral circuits), both upper-layer wirings and lower-layer wirings are arranged. "Minimum feature size" means a minimum width decided by photolithography processing technology, and a minimum space where the short-circuiting between wirings by a dielectric breakdown does not occur when potential differences arises between wirings.

In row decoders and sense amplifiers which adjoin memory cells, wires are formed with a broader size than those inside the cell array. In these areas, wirings with a finer feature size than those of the other peripheral circuits are used. Therefore, in the areas of the row decoders which drive memory cells and sense amplifiers which sense the memory cells, the problems above become particularly notable. In recent years, ultra-fine processing technology has progressed according to the development of an aligner. Therefore, layout patterns which can be easily exposed and processed are desired in wirings with nearly-minimum feature size.

In the semiconductor memory devices according to one embodiment of this invention, wirings with nearly-minimum feature size are arranged so that the wirings do not curve (a straight line pattern or a rectangle pattern). Moreover, a multilayer interconnection structure is used so that wiring widths and wiring intervals are broadened. Wiring widths and intervals are broadened in the upper-layer wirings. In the upper-layer wiring, the potential difference between wirings is smaller.

By taking a NAND type flash memory as an example, the semiconductor memory device of one embodiment of this invention is explained. In addition, this invention is not limited to NAND type flash memories but can be applied to other semiconductor memories.

FIG. 1 is referred to. The block diagram outline of the NAND type flash memory 1 according to this embodiment is shown in FIG. 1. The NAND type flash memory 1 according to this embodiment has a cell array 3 having memory cells 2 arranged in matrix form and a block decoder 4 (a row decoder). This NAND type flash memory 1, further has a sense amplifier part 5, an Hv-Tr area 6 and the sense amplifier area 7 in the sense amplifier part 5, a peripheral circuit 8 and a pad part 9.

Figure 2:
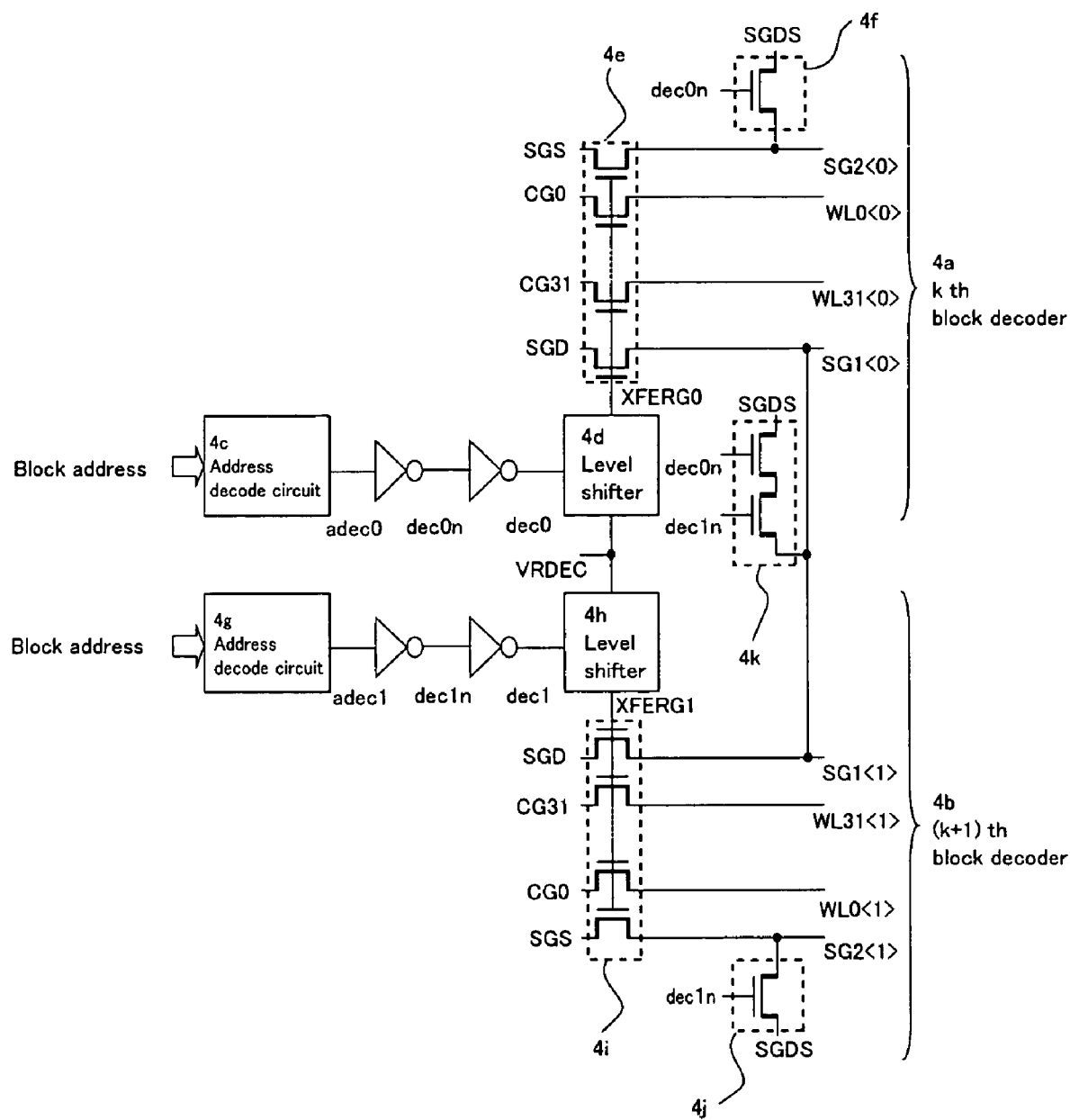
FIG. 2 is a schematic view of a number of circuit configurations of the block decoder of the NAND type flash memory concerning one embodiment of this invention.

FIG. 2 is referred to. FIG. 2 is a schematic view of the circuit diagram of the block decoder 4 of the NAND type flash memory according to this embodiment. In FIG. 2, a circuit 4a is the k-th block decoder. The circuit 4a has an address decode circuit 4c, a level shifter 4d, and a transmission circuit 4e (voltage is transmitted to word lines WL0<0>-WL31<0> and a selection gate line SG1). Furthermore, the circuit 4a has a circuit 4f (the voltage of SGDS is transmitted to the selection gate line SG2 <0>), and a circuit 4k (the voltage of SGDS is transmitted to the selection gate line SG1). A circuit 4b is the (k+1)-th block decoder. The circuit 4b has an address decode circuit 4g, a level shifter 4h, and the transmission circuit 4i (voltage is transmitted to word lines WL0<1>-WL31<1> and a selection gate line SG1). Furthermore, the circuit 4b has a circuit 4j (the voltage of SGDS is transmitted to the selection gate line SG2 <1>) and a circuit 4k (the voltage of SGDS is transmitted to the selection gate line SG1). In addition, in the embodiment, the k-th block decoder 4a and the (k+1)-th block decoder 4b are sharing the circuit 4k as shown in FIG. 2.

Each of block addresses is supplied to the k-th block decoder 4a and (k+1)-th block decoder 4b, respectively. The block addresses are received and decoded by the address decode circuits 4c and 4g, respectively. The level shifter circuits 4d and 4h change the voltage level of the decoded block addresses. The block addresses are transmitted to the gate electrode of transfer transistors via XFERG0 and XFERG1. These transfer transistors constitute the transfer circuits 4e and 4i. When the k-th block is a selected block, the voltage applied to XFERG turns ON the transfer transistors of the transfer circuit 4e. As a result, the voltages supplied to SGD, SGS, CG0-CG31 are transmitted to SG1, SG2, and WL0<0>-WL31 <0>, respectively. The above-mentioned operation is also the same for the transfer circuit 4i.

Figure 3:
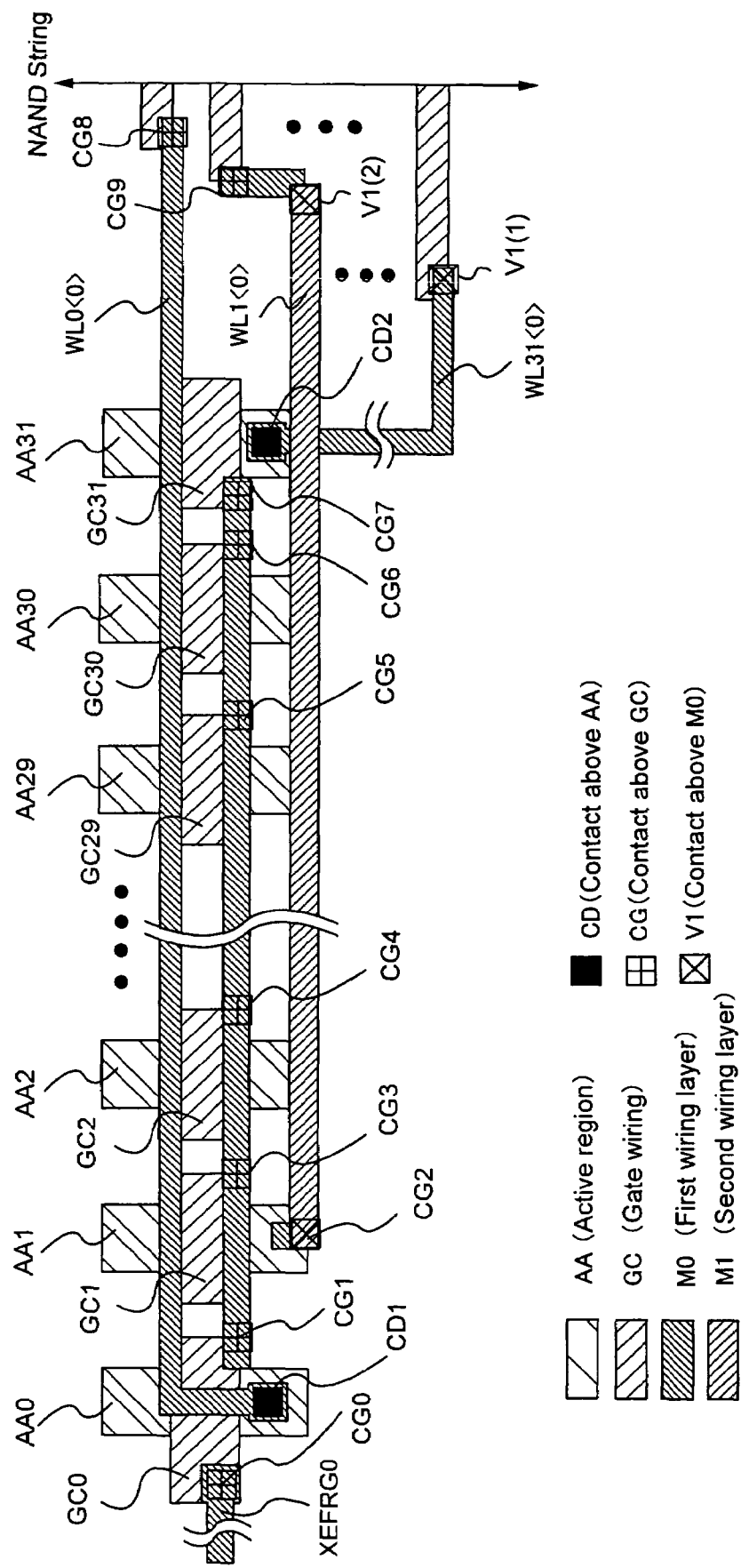
FIG. 3 is a schematic view of the layout of the transfer circuit in the block decoder of the NAND type flash memory of one embodiment of this invention.

Next, FIG. 3 is referred to. FIG. 3 is a schematic view of the layout of the transfer circuit 4e in the block decoder 4 of the NAND type flash memory of this embodiment. In FIG. 3, "AA" are active regions (AA0, AA1, AA2, ..., AA29, AA30, AA31) "GC" are gate wirings (GC0, GC1, GC2, ..., GC29, GC30, GC31). "M0" are wirings by a first wiring layer (hereafter "the first wiring layer" for convenience). "M1" are wirings by the 2nd wiring layer (hereafter "the 2nd wiring layer" for convenience) In this embodiment, "AA", "GC", "M0", and "M1" are stacked in this order. In FIG. 3, the sizes of the active region AA, the gate wiring GC, the first wiring layer M0, and the 2nd wiring layer M1 and their ratios are roughly outlined.

In FIG. 3, CD are contacts (CD1, CD2) which connect active regions (a substrate or the diffusion region on P-sub/well), and the first wiring layer M0. CG are contacts (CG0, CG1, CG2, CG3, CG4, CG4, CG5, CG6, CG7, CG8, CG9) which connect the gate wirings GC and the first wiring layer M0. V1 are contacts (V1 (1), V1 (2)) which connect the first wiring layer M0 and the 2nd wiring layer M1.

In the layout arrangement of the transfer circuit of this embodiment shown in FIG. 3, WL0<0>-WL31 <31> are extended to the NAND string's memory cells. This extension is performed by using three layers, the gate wiring GC, the first wiring layer M0, and the 2nd wiring layer M1. In the region of the NAND string's memory cells, the gate wirings of the NAND string's memory cells are parts of word lines WL0<0>-WL31<31>, respectively as shown in FIG. 3. 40 are wirings of the first wiring layer M0 which connect gate wirings (GC0, GC1, GC2, GC29, GC30, GC31) mutually. As for word lines WL0<0>-WL31<0> and wiring 40, it is desirable, above the transfer transistors, that they are straight (the shape of a straight line) in forming word lines WL0<0>-WL31 <31> by means of a photolithography technology used for the normal semiconductor process. If word lines WL0<0>-WL31 <31> and wiring 40 are straight (the shape of a straight line), formation is made easier and a high yield can be realized.

The layout of this embodiment has a wiring structure using three layers, such as a gate wiring layer, a first wiring layer, and the 2nd wiring layer. As a result, the wiring pitch can be broadened and the voltage tolerance between wirings can also be improved. The temperature in processing the wiring is lower for the upper wirings. The temperature in forming the interlayer insulation films between adjacent wiring layers and between wiring layers in different layers is also lower for the upper wirings. If an interlayer insulation film is formed at high temperature, the insulating property of the interlayer insulation film will improve. However, the interlayer insulation film formed in the upper layer is formed at a low temperature. The voltage tolerance between wirings in the upper wirings decreases. Thus, the voltage tolerance of the first wiring layer M0 is lower than that of the gate wiring GC. The voltage tolerance of the 2nd wiring layer M1 is lower than that of the first wiring layer M0. Therefore, it is desirable that $$WGC \leq WM0 \leq WM1$$

(WGC is the wiring width of the gate wiring GC, WM0 is the wiring width of a first wiring layer, and WM1 is the wiring width of the 2nd wiring layer). For the same reason, it is desirable that $$SGC \leq SM0 \leq SM1$$

(SGC is a space between gate wiring GC (s), it is a space between SM0 first wiring layers, and SM1 is a space between the 2nd wiring layers).

In the NAND type flash memory of this embodiment, it is necessary to transmit program voltage Vpgm to word lines WL0<0>-WL31<0> through transfer transistors at programming of data to the memory cells. Voltage $$Vpgmh \geq Vpgm + Vth$$

(Vth is the threshold voltage of transfer transistors) for transmitting the program voltage Vpgm by transfer transistors is applied to XFERG connected to the gate electrodes of transfer transistors from the level shifter 4.0V may be applied to some word lines WL0<0>-WL31<0> at the time of programming of data. Therefore, the maximum potential difference between the 1st wiring layers M0 is Vpgmh. That is, the potential difference between the 1st wiring layers M0 is no greater than Vpgmh. As another layout method, the gate wirings 40 (GC0, GC1, GC2, ..., GC29, GC30, GC31) can also be short-circuited by single gate wiring. In this case, the maximum potential difference between the 1st wiring layers M0 is the same as the maximum potential difference between the word lines WL<0>-<31>, Vpgm (maximum potential difference≤Vpgm between the 1st wiring layer M0). In that case, the gate wirings 40 (GC0, GC1, GC2, ..., GC29, GC30, GC31) pass above the element isolations between active regions (AA0, AA1, AA2, ..., AA29, AA30, AA31) completely. Therefore, it is necessary to design devices so that field inversion leak current may be sufficiently low in case of the layout method shown in FIG. 3. Therefore, the maximum potential difference between the 1st wiring layers M0 is no greater than Vpgm or no greater than Vpgmh.

As for the 2nd wiring layer M1, in the selected blocks during erase, nearly equal to Vera is applied to SG1 or SG2<0>/<1> and 0V is applied to word lines WL0<0>-WL31<0>. Therefore, the maximum potential difference between the 2nd wiring layers M1 is Vera. On the other hand, in the selected blocks during program, 0V is applied to SG2<0>/<1> and Vpgm is applied to one of the word lines WL0<0>-WL31<0>, the selected word line. Therefore, the maximum potential difference between the 2nd wiring layers M1 is Vpgm. Thus, the maximum potential difference between the 2nd wiring layers M1 is no greater than Vpgm or Vera.

As for the gate wirings GC, the word lines WL which are applied with program voltage Vpgm, and the word lines WL which are applied with 0V may be adjacent and counter. Therefore, the maximum potential difference between the gate wirings GC is Vpgm. Therefore, the potential difference between the gate wirings GC is no greater than Vpgm.

Thus, according to one embodiment of this invention, wiring widths and wiring intervals are broadened. Furthermore, the potential differences between wirings become small. As a result, a reliable semiconductor memory device is obtained.

Embodiment 1

The NAND type flash memory shown in FIG. 1 is taken as an example, and the semiconductor memory device of this embodiment is explained. A layout arrangement of the sense amplifier part 5 of NAND type flash memory is explained.

Figure 4:
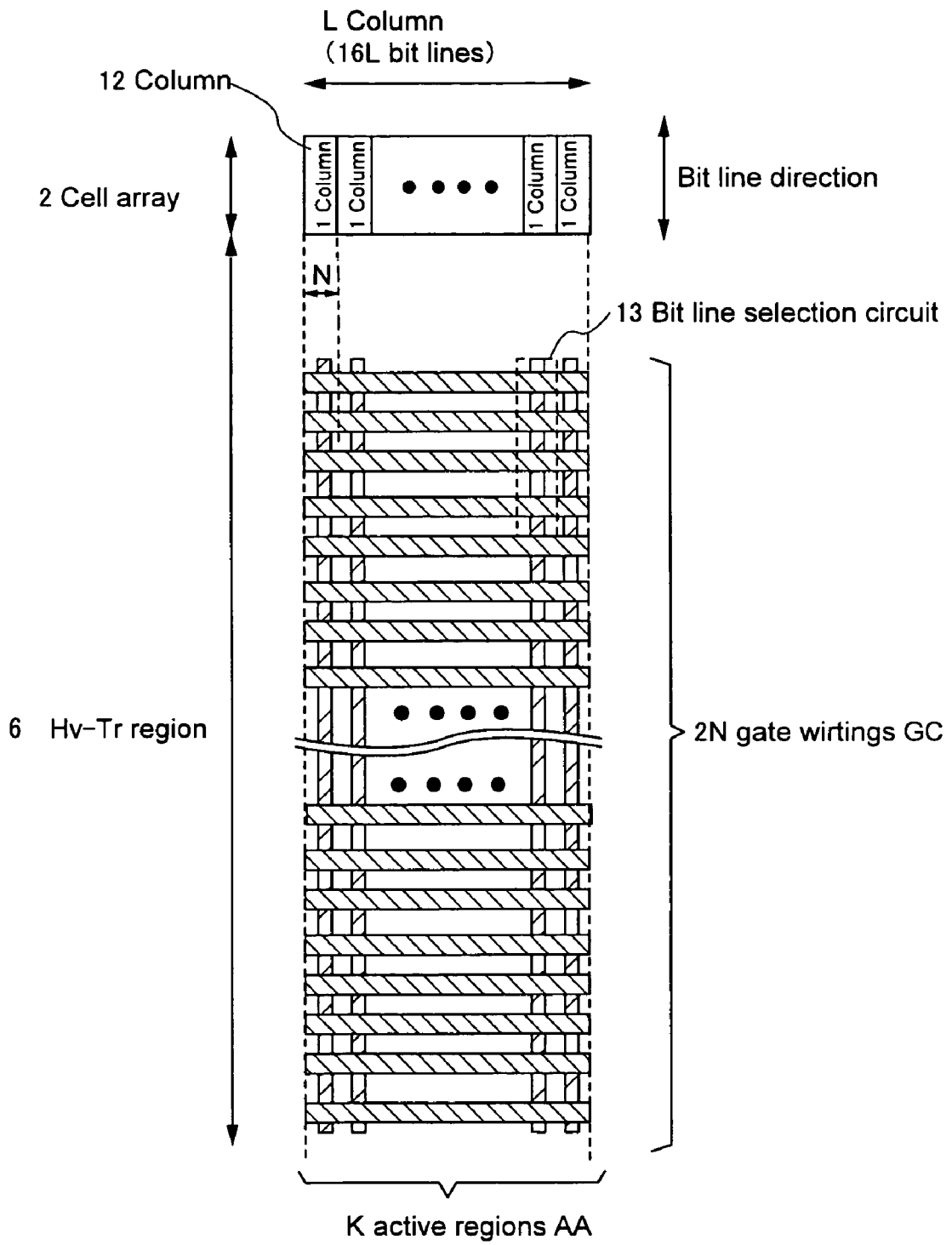
FIG. 4 is a schematic view of the layout of the sense amplifier part 5 in the NAND type flash memory of one embodiment of this invention.

FIG. 4 is referred to. FIG. 4 shows the schematic view of the layout of the Hv-Tr region 6 in the sense amplifier part 5 in the NAND type flash memory shown in FIG. 1. In FIG. 4, only the active region AA and gate wiring GC are illustrated for the convenience of explanation. The 1st wiring layer M0 and the 2nd wiring layer M1 are omitted.

The plurality of bit line selection circuits 13 is formed in the Hv-Tr region 6 (High Voltage-Transistor). This is because the sense amplifier located in the sense amplifier region 7 is connected to bit lines. 3 are cell arrays and have the memory cells 2 arranged in the shape of a matrix. FIG. 4 shows only L columns 12 in the cell arrays. The memory cells 2 of bit lines 16 are arranged in one column 12. Therefore, in FIG. 4, the layout arrangement of the bit line selection circuits 13 corresponding to L columns (bit lines of 16 L books) are shown. Moreover, in FIG. 4, a plurality of bit line selection circuits is formed of k lines of active regions and 2N wiring gates GC. Connection wirings with the Hv-Tr region 6 and the cell arrays 3 (columns 12) are omitted for the convenience of explanation.

Figure 5:
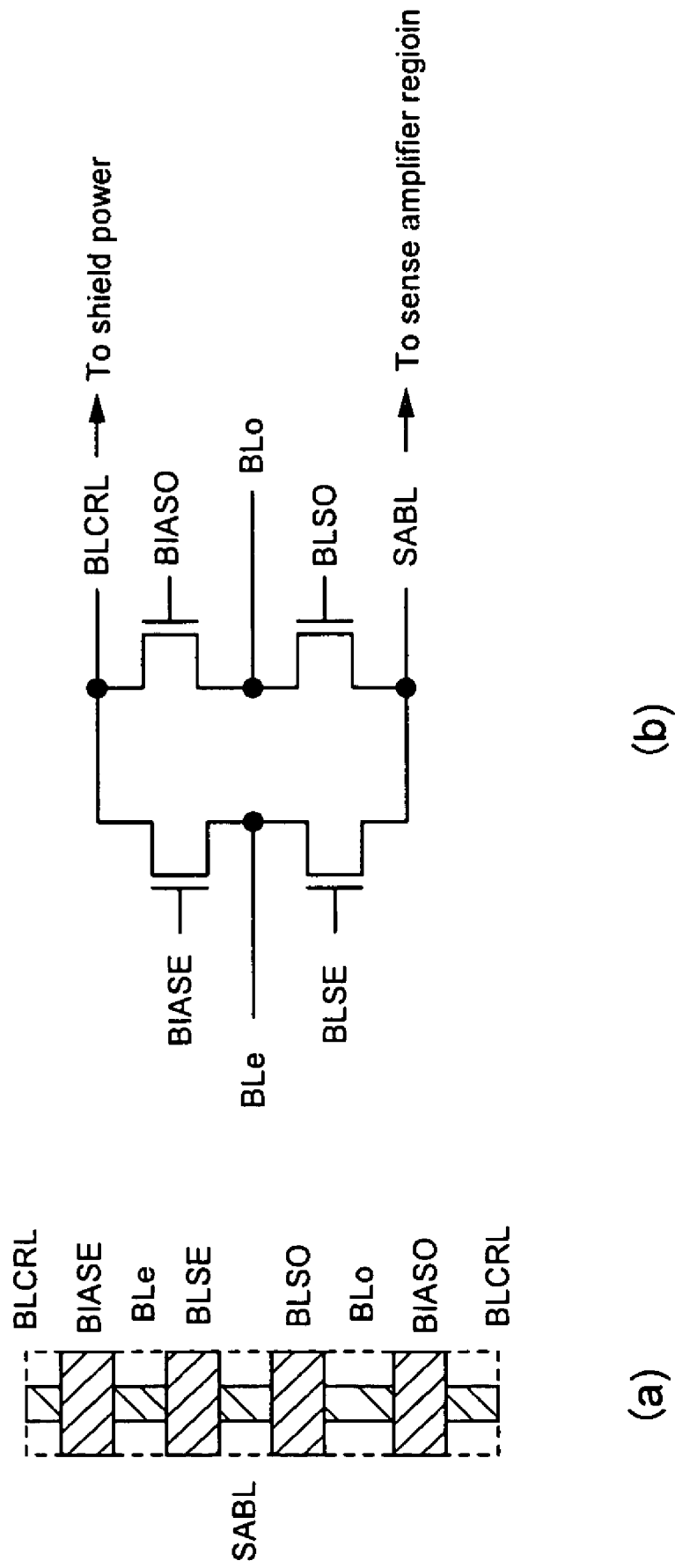
FIG. 5(a) is an enlargement of the bit line selection circuit 13 in one embodiment of this invention.
FIG. 5(b) is an equivalent circuit of the bit line selection circuit 13.

In this embodiment, each parameter is set up as follows. The number of the bit lines corresponding to the pitch (the sum of the width of AA and its space) of the active regions AA is set to N. (N=2×M×L, M: a natural number, and L: the number of columns corresponding to the active regions) The bit lines corresponding to L columns are 16L. Therefore, it becomes $16L = K \times L = 2 \times M \times K \times L$ As a result, the number of the active regions corresponding to L columns is set to $16L/N = (2 \times M \times K \times L)/(2 \times M \times L) = K$ Next, FIG. 5 is referred to. FIG. 5(a) is an enlargement of the bit line selection circuits 13. FIG. 5(b) is a diagram for equivalent circuits of the bit line selection circuits 13. As shown in FIG. 5(a) and (b), BIASE, BIASO, BLSE, BLSO, BLe, BLo, BLCRL and SABL are connected to the bit line selection circuits 13. In FIGS. 4 and 5(a), contacts and wiring layers of BLe, BLo, BLCRL and SABL are omitted for the convenience of explanation.

Figure 6:
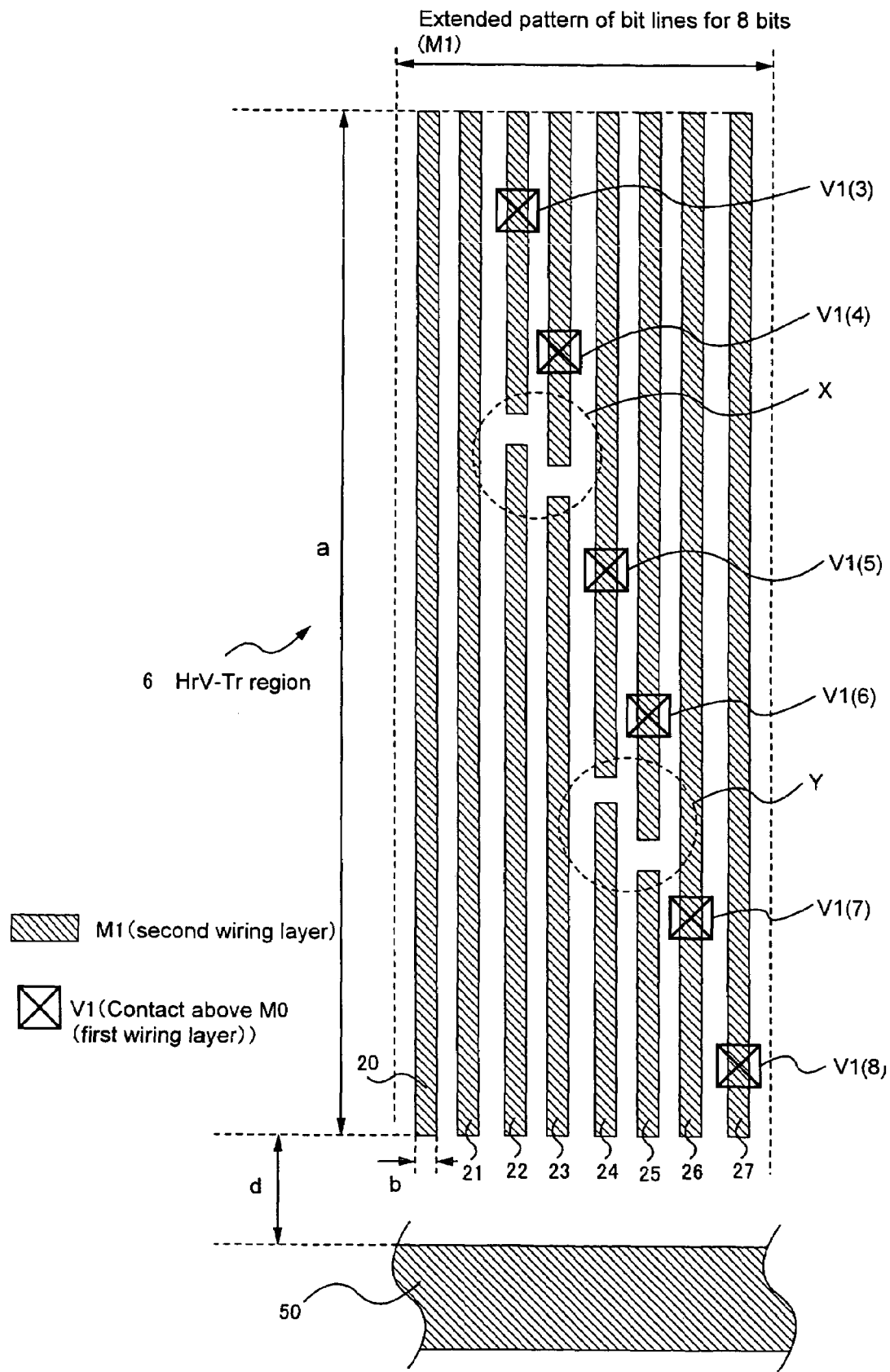
FIG. 6 shows the layout of the sense amplifier part 5 of the NAND flash memory concerning one embodiment of this invention.

Next, FIG. 6 is referred to. FIG. 6 shows the layout of 2nd wiring layers M1 (20-27) corresponding to 8 bit lines of the sense amplifier part 5 of NAND flash memories concerning this embodiment. 16 L bit lines are contained in the region which consists of L columns in FIG. 4. For this reason, L2 layouts of 8 bit lines shown in FIG. 6 exist in the region which consists of L columns in FIG. 4. In FIG. 6, contacts which connect the 1st wiring layers M0 and the 2nd wiring layers M1 are V1 (3), V1 (4), V1 (5), V1 (6), V1 (7), and V1 (8).

In bit lines which consist of the 2nd wiring layers M1 in the sense amplifier parts, wirings are turned or broken off. However, in one embodiment of this invention, bit lines which consist of the 2nd wiring layers M1 are formed by using only a straight pattern (the shape of a straight line) as shown in FIG. 6. Thereby, in a layout, it becomes easy to form the minimum width and space of the 2nd wiring layers M1 (bit lines) by using photolithography technology. Moreover, this leads to a layout pattern which can realize a high yield.

In this embodiment, bit lines cut or break off partially in the Hv-Tr regions 6 in areas shown by "X" and "Y" of FIG. 6. After breaking off the bit lines are set to floating states. In this embodiment, an example of the bit lines cutting or breaking off partially is shown. However, it is possible that bit lines do not cut or break off and all lengths of bit lines are set equally so that the wiring capacity of bit lines can be equal. Thereby, it becomes much easier to form the 2nd wiring by using photolithography technology.

By adopting a layout as shown in FIG. 6, the widths and the intervals (Line and Space (L/S)) of bit lines can continue to maintain a steady value in the Hv-Tr region 6.

50 is a dummy pattern formed of the 2nd wiring layers. As for detailed patterns such as the 2nd wiring layers M1 (20-27), due to the influence of the focus fluctuation at the time of exposure or the influence of aberration of the lens of exposure device, sizes thereof become short. "Separation" from substrate films may be generated at the photo-resist-removed part caused by short sizes in the case of pattern parts where contact areas with substrate films are small including line tip parts. To the 2nd wiring layers M1 (20-27), while keeping certain distance d, dummy patterns 50 are formed. Thereby, "short size" and "separation" can be prevented. As long as they are patterns which counter the 2nd wiring layers M1 (20-27), this embodiment is not limited to dummy patterns.

As an example, in this embodiment, the widths and the intervals (L/S) of bit lines shall be 55 nm/55 nm in order to maintain a fixed value. The widths and the intervals (L/S) of bit lines are not necessarily limited to the value of this embodiment. In consideration of voltages applied to bit lines and the voltage tolerance of the insulating films and the others, the widths and intervals (L/S) of bit lines may take other values such as 70 nm, 40 nm and 30 nm.

The lengths of wiring patterns (wirings of the topmost part of the bit lines) (M1) 20-27, which bit lines extend to, are set to a, and their widths are set to b. As for aspect ratios (a/b), it is desirable that they have the following relations. In performing lithography of pattern wirings which these bit lines extend to, for example, an ArF excimer laser (fluoridation argon with 198 nm wavelength) and a half-tone photolithography mask are used. In this case, line widths (b) up to 99 nm □100 nm can be formed without the interference of a light source. The pattern wirings (M1) 20-27 which bit lines extend to may be set to a=1 mm or more. Therefore, while setting a/b=1 mm/100 nm=$10^4$, it is desirable that the aspect ratios of the pattern wirings which bit lines extend to are $10^4$ or more.

Figure 7:
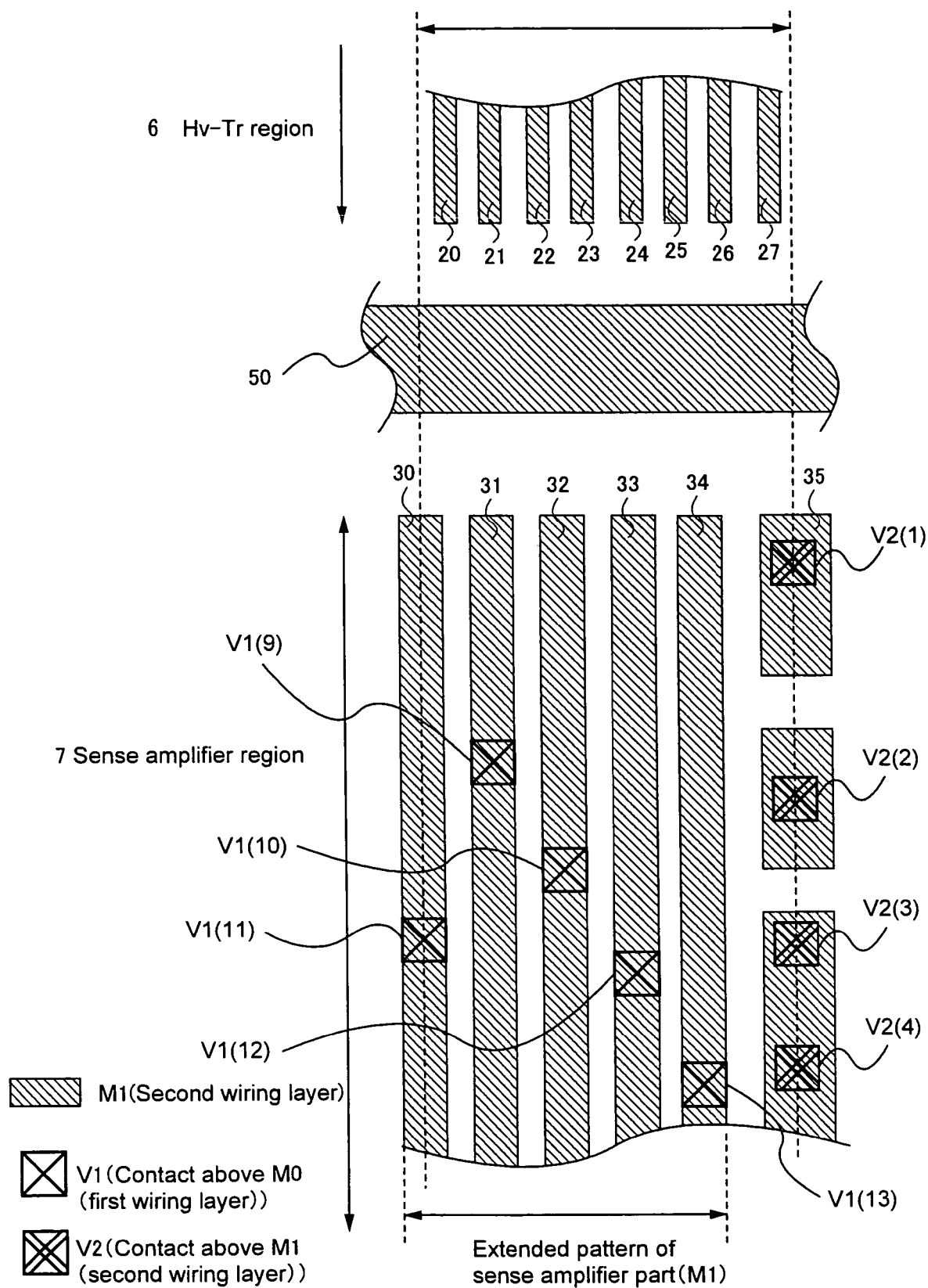
FIG. 7 shows the layout in the Hv-Tr region 6 of the NAND flash memory concerning one embodiment of this invention, and the layout in the sense amplifier region 7.

Next, FIG. 7 is referred to. FIG. 7 is a layout of the 2nd wiring layers M1 (20-27) in the Hv-Tr region 6 and a layout of the 2nd wiring layers M1 (30-35) in the sense amplifier regions 7. As shown in FIG. 7, the widths of the 2nd wiring layers M1 (30-35) in the sense amplifier regions 7 are larger than those of the 2nd wiring layers M1 (20-27) in the Hv-Tr regions 6. When connecting between the wirings from which the widths of wiring layers differ, one embodiment of this invention can be used effectively.

The example shown in FIG. 7 is a case where SABL shown in FIG. 5(a) is connected. In FIG. 7, the 1st wiring layers and the 3rd wiring layers M2 are omitted. In this embodiment, as shown in FIG. 7, there are 8 lines of the 2nd wiring layers M1 (20-27 (SABL node of 8 bit line selection circuits 13)) in the area where the bit lines of the Hv-Tr regions 6 extend. The end part of the 2nd wiring layers M1 is uniformed. 8 of these 2nd wiring layers M1 (20-27) are once connected with the 1st wiring layers M0 (not shown) through contact V1 in the active regions BLe and BLo of the bit line selection circuits shown in FIG. 5(a) and (b). From the active region SABL, through the 1st wiring layer M0 (not shown) and contact V1, a layout which is pulled up in 4 of the 2nd wiring layers M1 (31-34) of the sense amplifier regions 7 is adopted. By such a layout, all of the 2nd wiring layers M1 (20-27 and 30-35) consist of only straight patterns (the shape of a straight line).

In other words, in this embodiment, for 8 bit line pitches, there are 4.5 of the 2nd wiring layers (31-34 and a half of 30) that arrange contacts V1 (contact on the 1st wiring layers M0) and there is 0.5 of the 2nd wiring layers (half of 35) that arrange V1 and V2 (contacts on the 2nd wiring layers M1). As shown in FIG. 7, the 2nd wiring layers M1 (31-34) of the sense amplifier regions 7 of this embodiment can consist of only straight patterns which do not cut or break off. Moreover, although the 2nd wiring layers M1 (31-34) of the sense amplifier regions 7 concerning this embodiment cut or break off in part, the 2nd wiring layers M1 can consist of straight (the shape of a straight line) patterns.

According to one embodiment of this invention, when extending SABL from the Hv-Tr regions 6 to the sense amplifier regions 7, the 2nd wiring layers can consist of straight patterns. The 2nd wiring layers, which are easy to process and realize a high yield, can be formed.

Embodiment 2

In this embodiment, a layout in the case that 4 bit lines correspond to one active region AA which forms the bit line selection circuits 13 is explained in the Hv-Tr region 6 of the semiconductor memory device explained in the embodiment 1.

Figure 8:
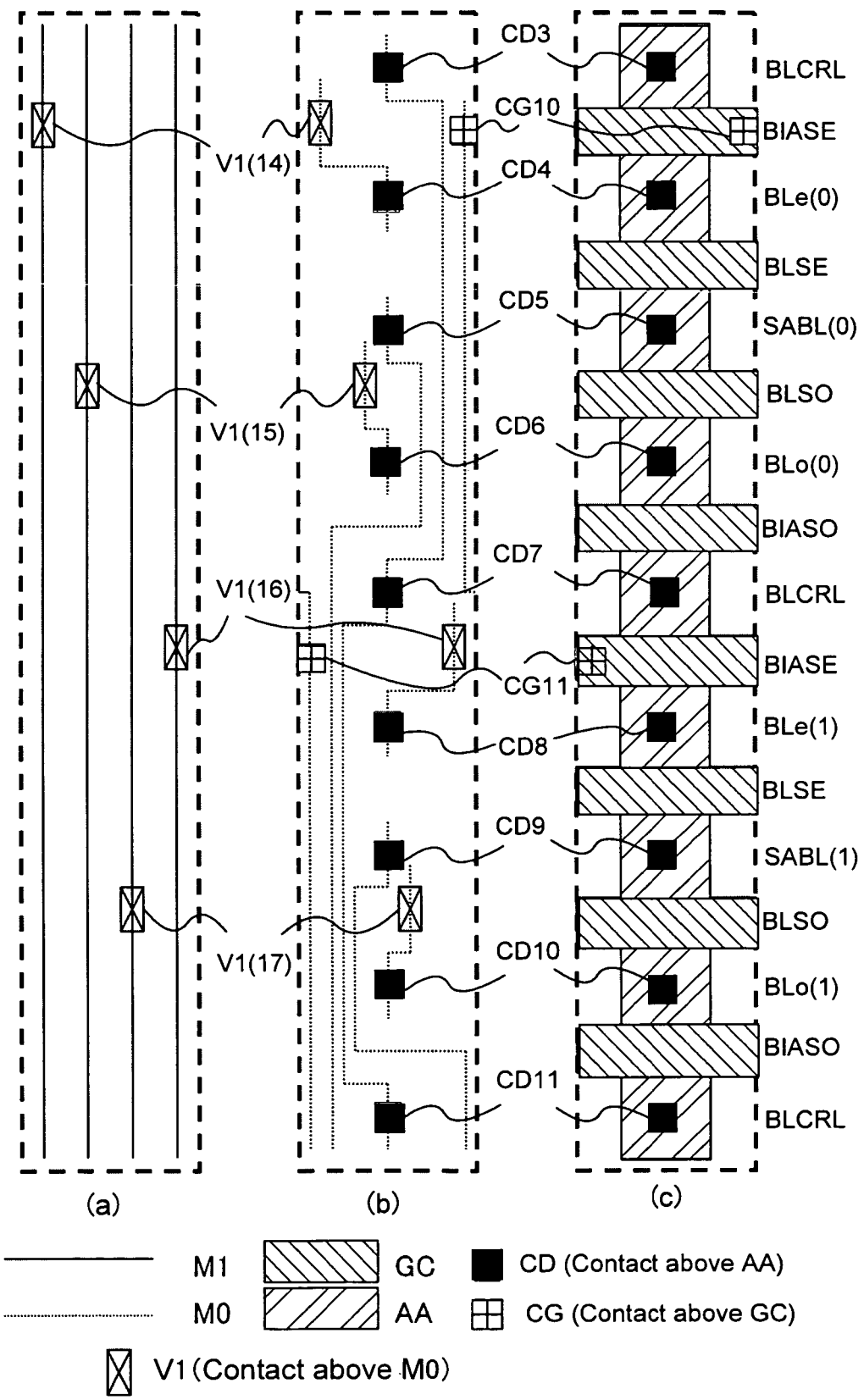
FIG. 8 shows the layout in the Hv-Tr region 6 of the NAND flash memory concerning one embodiment of this invention.

FIG. 8(a) is the 2nd wiring layers M1 and contacts V1 (contacts which connect the 1st wiring layers M0 and the 2nd wiring layers M1). FIG. 8(b) is the 1st wiring layers M0, contacts V1, contacts CG (contacts which connect the gate wirings GC and the 1st wiring layers M0) and contacts CD (contacts which connect active regions (substrates or diffusion regions above P sub/wells) and the 1st wiring layers M0). FIG. 8(c) is active regions AA, gate wirings GC, contact CD and contacts CG. FIG. 8(c) shows clearly a layout pattern of two bit line selection circuits 13. In addition, for convenience of explanation, the 2nd wiring layers M1 and the 1st wiring layers M0 are not illustrated by the line. However, the 2nd wiring layers M1 and the 1st wiring layers M0 are wiring layers which have actual certain widths.

In this embodiment, as shown in FIG. 8(b), the 1st wiring layers M0 are configured so as to bend in a U shape and step-wise. All of 4 of the 2nd wiring layers M1 extended from 4 bit lines are formed only by a straight pattern (the shape of a straight line) as shown in FIG. 8(a).

According to one embodiment of this invention, when extending the bit lines BLe or BLo from the Hv-Tr regions 6 to SABL through the bit line selection circuits 13 to the sense amplifier regions 7, the 2nd wiring layers can be configured only by straight patterns. The 2nd wiring layers that realize a high yield with easy processing can be formed.

Embodiment 3

Here, another example of patterns of gate wirings are explained. A layout of GC circuit patterns of this embodiment can be used for the above-mentioned embodiment.

Figure 9:
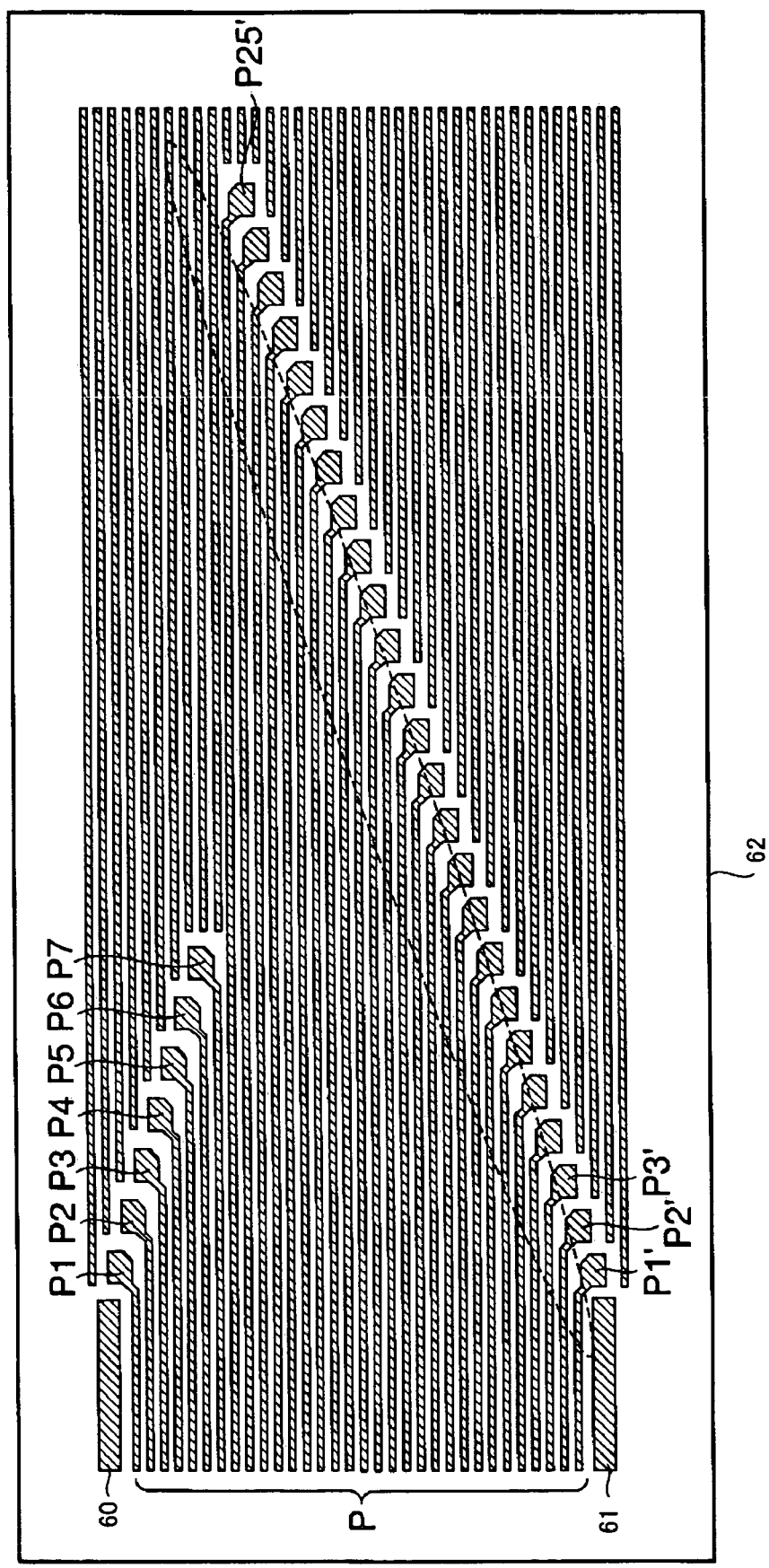
FIG. 9 is a plan view showing the layout of GC pattern of the NAND flash memory concerning one embodiment of this invention.

FIG. 9 is a plan view showing the terminal layout pattern of this embodiment for selection gates and word lines. The selection gates (select gates) 60 and 61 and the circuit patterns including 32 GC wiring gate patterns P (P1-P7, P1'-P25') are arranged above semiconductor substrates (wafers) 32. 32 GC wiring gate patterns P are arranged in a certain pitch between the selection gates 60 and 61. A pitch does not need to be fixed. The longitude direction of 32 GC wiring gate patterns P is the same. In a direction perpendicular to the longitude direction, 32 GC wiring gate patterns P are arranged. In FIG. 9, for convenience of explanation, only referential marks of P'1, P'2, P'3 and P'25 are written, among the referential marks P'1 to P'25.

In GC circuit pattern P1-P7 arranged under the selection gate 60, the gate pattern arranged at the bottom has a long size at a longitudinal direction.

The length of the longitudinal direction of the gate pattern part of the GC circuit pattern P2 is longer than the length of the longitudinal direction of the gate pattern part of the GC circuit pattern P1. Similarly, the length of the longitudinal direction of the gate pattern part of the GC circuit pattern P3 is longer than the length of the longitudinal direction of the gate pattern part of the GC circuit pattern P2. The length of the longitudinal direction of the gate pattern part of the GC circuit pattern Pi (i=2-7) is longer than the length of the longitudinal direction of the gate pattern part of GC circuit pattern Pi-1.

The difference (fixed length) of the length of the longitudinal direction of the gate pattern part of the GC circuit pattern Pi and the length of the longitudinal direction of the gate pattern part of GC circuit pattern Pi-1 does not need to be the same.

The GC circuit pattern P2 is longer than the GC circuit pattern P1. On this circuit pattern, the gate extension part of the GC circuit pattern P1 is arranged. Similarly, the gate extension part of the GC circuit pattern P2 is arranged on the GC circuit pattern P3 longer than the GC circuit pattern P2.

The GC circuit pattern Pi is longer than GC circuit pattern Pi-1. The gate extension part of the GC circuit pattern Pi is arranged at the upper part (inside of an open space). The gate extension part of GC circuit pattern Pi-1 and the gate extension part of the GC circuit pattern Pi do not overlap. These do not overlap in the arrangement direction of GC circuit pattern P. The GC circuit patterns P1-P7 are arranged in this way.

In GC circuit pattern P1'-P25' arranged on the selection gate 31, the length of the longitudinal direction of the gate pattern part of GC circuit pattern arranged at the top is long.

The length of the longitudinal direction of the gate pattern part of the GC circuit pattern P2' is longer than the length of the longitudinal direction of the gate pattern part of the GC circuit pattern P1'. Similarly, the length of the longitudinal direction of the gate pattern part of the GC circuit pattern P3' is longer than the length of the longitudinal direction of the gate pattern part of the GC circuit pattern P2'.

The length of the longitudinal direction of the gate pattern part of the GC circuit pattern Pj' (j=2-7) is longer than the length of the longitudinal direction of the gate pattern part of GC circuit pattern Pj-1'.

The difference (fixed length) of the length of the longitudinal direction of the gate pattern part of the GC circuit pattern Pj' and the length of the longitudinal direction of the gate pattern part of GC circuit pattern Pj-1' does not need to be the same.

The GC circuit pattern P2' is longer than the GC circuit pattern P1'. On this circuit pattern, the gate extension part of the GC circuit pattern P1' is arranged. Similarly, the gate extension part of the GC circuit pattern P2' is arranged on the GC circuit pattern P3' longer than the GC circuit pattern P2'.

The GC circuit pattern Pj' is longer than GC circuit pattern Pj-1'. The gate extension part of the GC circuit pattern Pj is arranged at the upper part (inside of an open space). The gate extension part of GC circuit pattern Pj-1' and the gate extension part of the GC circuit pattern Pj' do not overlap. These do not overlap in the arrangement direction of GC circuit pattern P. The GC circuit patterns P1'-P25' are arranged in this way.

Embodiment 4

Here, the patterns (M1) etc. and the dummy pattern 50 of bit line extension portions have countered as the above-mentioned embodiment explained. Hereafter, these are explained in detail.

Figure 10:
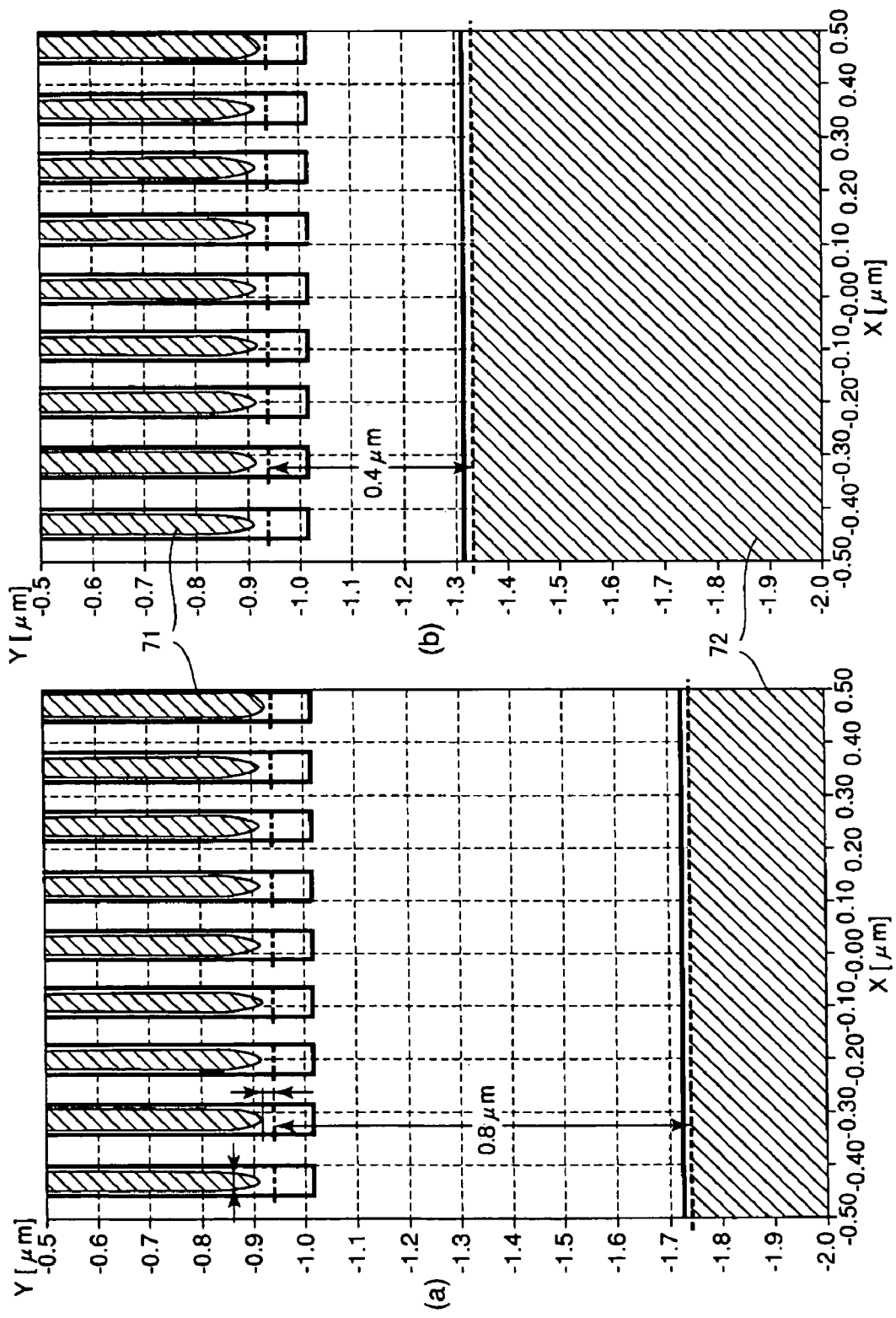
FIG. 10 shows the resultant form on the wafer after the lithography of the line end tip part of the NAND flash memory concerning one embodiment of this invention.

FIG. 10 shows the photo-resist form of the line tip part in the wafer after lithography. In FIG. 10, 71 is a device pattern after exposure and 72 is a dummy pattern after exposure. In FIG. 10, the solid lines are the plane forms of the mask patterns after OPC (Optical Proximity Correction) processing. The dotted lines are the design patterns. FIG. 10 shows the photo-resist form on the wafer computed from the mask pattern after OPC.

FIG. 10(*a*) shows the example to which another pattern exists in the position which is separated about 0.8 micrometers from the line end. FIG. 10(*b*) shows the case where another pattern exists in the position which is separated about 0.4 micrometers from the line end. Another pattern which counters the line end can be a dummy pattern or a device pattern.

In FIG. 10(*a*) and (*b*), the form of a line tip part differs. In (a), the contact with a tip part and the ground is sufficient. In (b), a tip part sharpens and the contact with the ground is inadequate. As a result, the photo-resist in a line end may fall in (b). From the viewpoint of lithography, (a) is more desirable.

Figure 11:
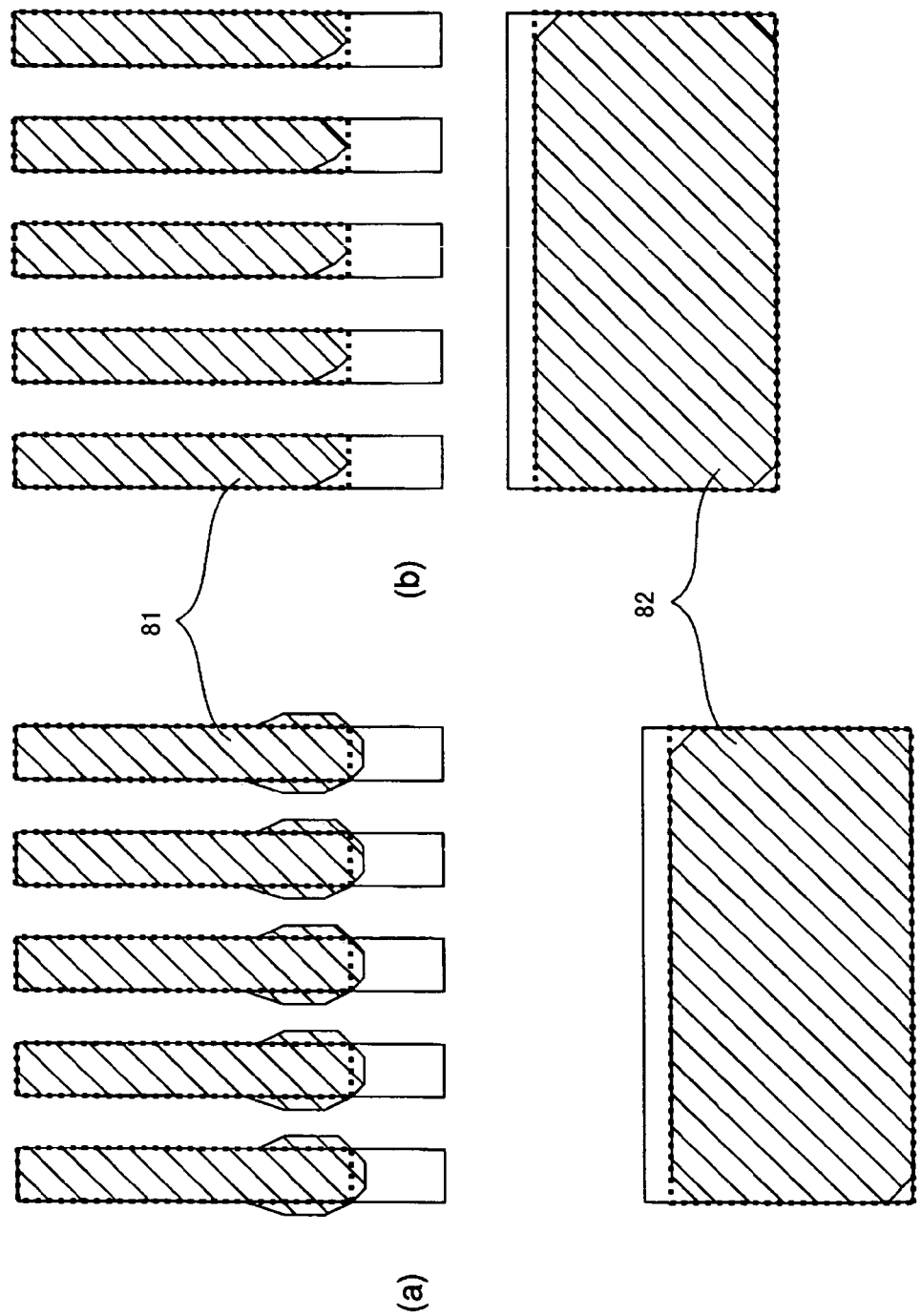
FIG. 11 shows the resultant form after carrying out etching processing using photo-resist pattern of FIG. 10.

FIG. 11 shows the photo-resist form etched using the photo-resist form of FIG. 10. In FIG. 11, 81 is a device pattern after etching and 82 is a dummy pattern after etching. The dotted line shows the mask pattern plane form after OPC like FIG. 10. The solid line shows the design pattern.

In FIG. 11(*a*), the distance between the dummy patterns 82 which counter the line end and the line end of the device pattern 81 is separated. As a result, the area etched increases. Also, a reaction product adheres to the line end easily as a side wall sediment. For this reason, on a wafer, the line end may contact and it may short-circuit electrically. Moreover, in FIG. 11(*b*), the distance of the line end and another pattern is small. There is less area etched than (a) and there is little side wall sediment adhesion of a reaction product. That is, when seen from the viewpoint of etching, since (b) can reproduce a photo-resist form faithfully, it is desirable.

Figure 12:
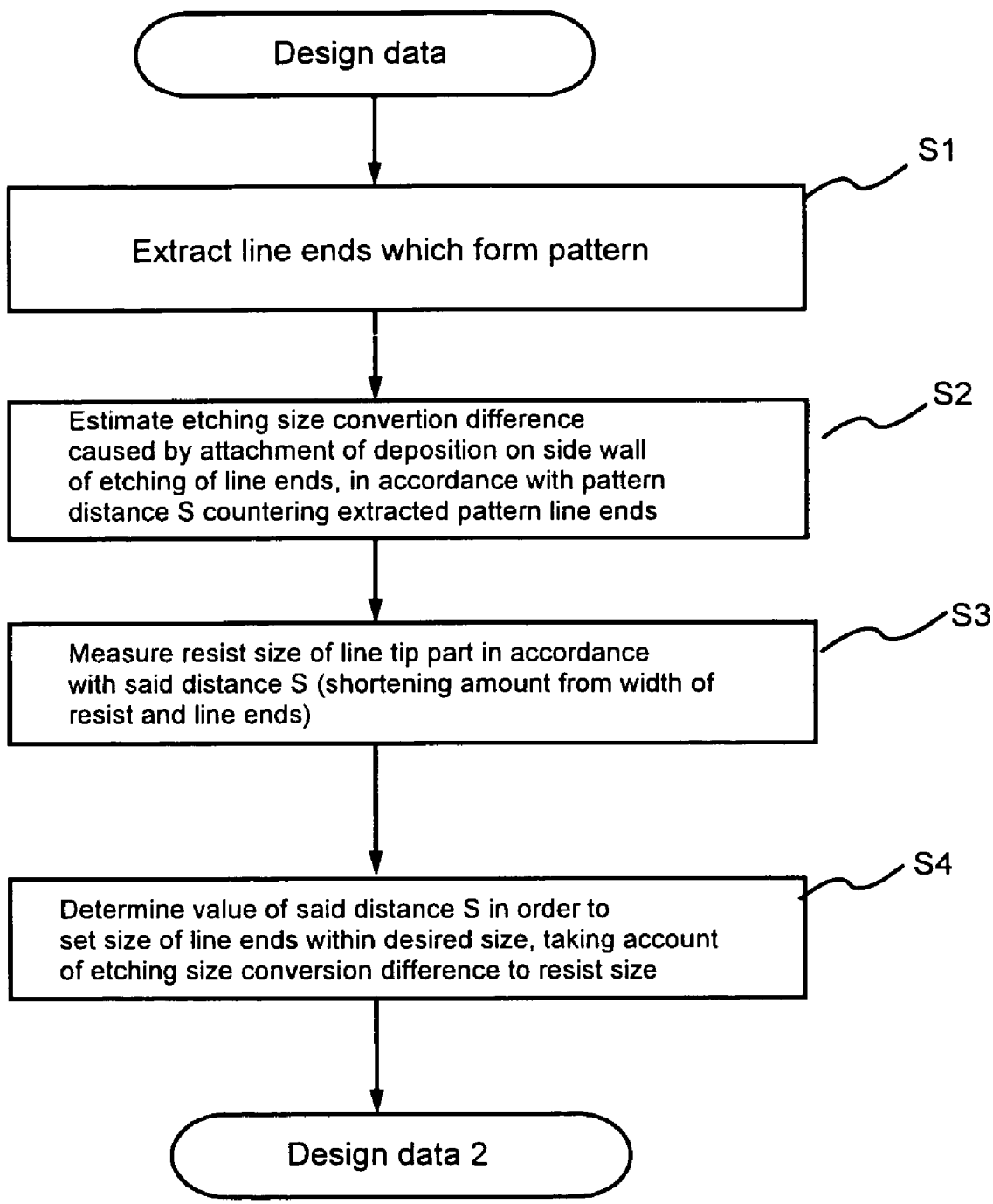
FIG. 12 is a flow chart which shows the procedure for creating compensation data from the design data of the NAND flash memory concerning one embodiment of this invention.

These viewpoints were taken into consideration in this embodiment. According to the distance from the line end to another pattern, the quantity of the side wall sediment which adheres to a line end after etching was estimated. The changes in the photo-resist size in a line end and the amount of shortenings in the line tip part (the amount of retreat) were estimated. The flow chart is shown in FIG. 12.

Figure 16:
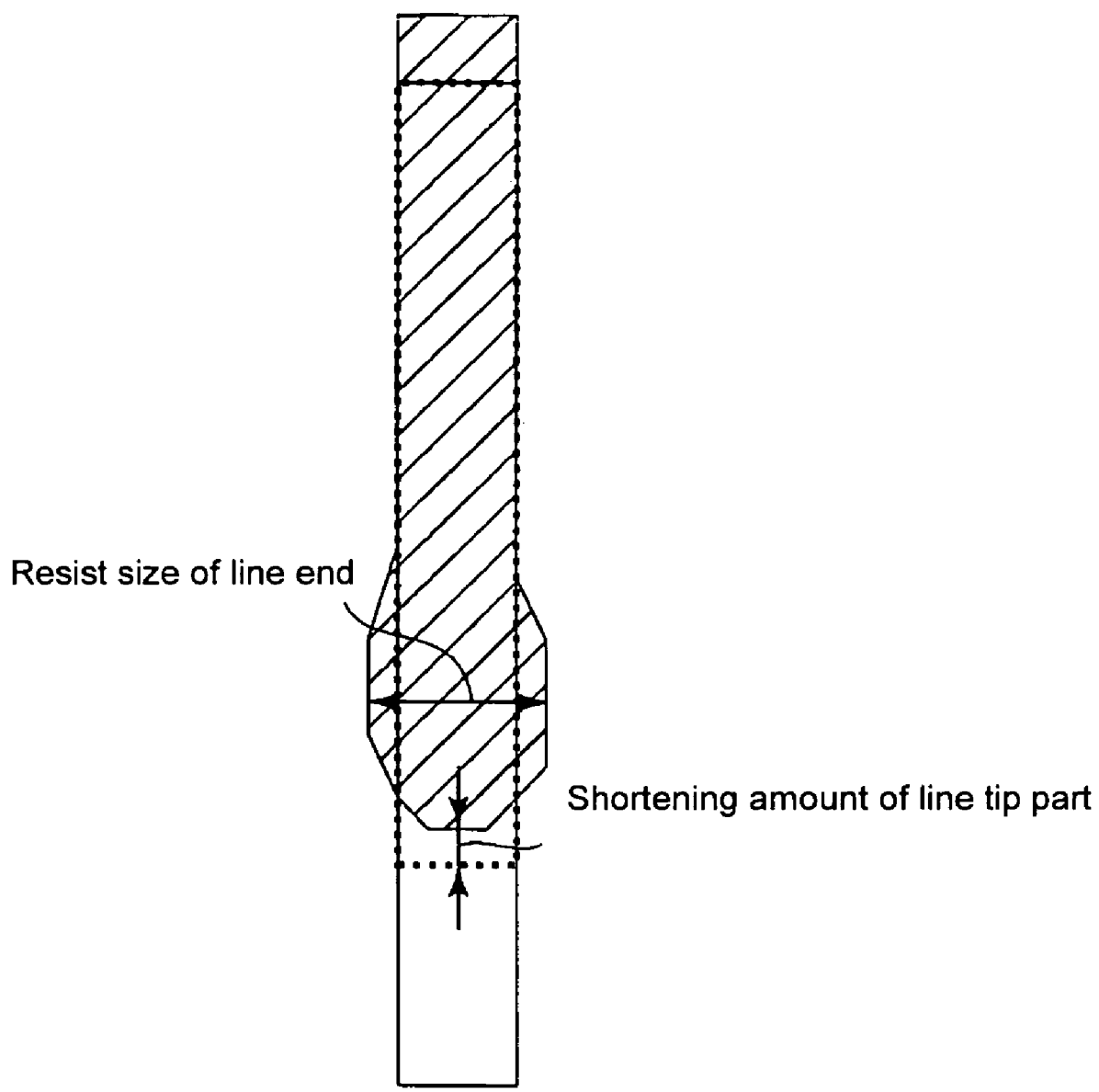
FIG. 16 is a figure for defining the photo-resist size of the line end in one embodiment of this invention.

First, the end of the line which accomplishes the device pattern is extracted from the design data (Step S1). Subsequently, the relation between Distance S (distance with the dummy pattern which counters the extracted end and this end), and the etching size conversion difference (side wall sediment adhesion of etching with a photo-resist mask) of the line end is measured (Step S2). Then, the photo-resist size of the line end after lithography and a relation with Distance S are measured (Step S3). Subsequently, the value of Distance S is determined so that the final size (the final size of the line end in consideration of the photo-resist size and then etching size conversion difference) will be within a predetermined size (Step S4). The photo-resist size of the line end is shown in FIG. 16.

In FIG. 13(*a*), the horizontal axis is the distance S to the pattern which counters from a line tip part. The vertical axis is the amount of change of the size of the line end by adhesion of the side wall sediment generated by etching (etching conversion difference: difference of the size after etching, and a photo-resist size). In FIG. 13(*b*), the horizontal axis is the distance S to the pattern which counters from a line tip part. The vertical axis is the amount of dimensional change of the line tip part by adhesion of the side wall sediment generated by etching. If Distance S is large, both the amount of dimensional change of the line end by etching and the amount of dimensional change of a line tip part will become large.

Furthermore, Distance S, the photo-resist size of a line end and the amount of shortenings of the line tip part were estimated using the simulation of lithography. FIG. 14(*a*) shows the photo-resist size in a line end. FIG. 14(*b*) shows the amount of shortenings in a line tip part. This graph shows the results under specific exposure conditions. If an exposure wavelength of an aligner, a lens numerical aperture, lighting form, pattern line width, and OPC conditions (the length of jog) change, the graph will also change.

FIG. 15 shows the size after the last processing in consideration of a photo-resist size and an etching conversion difference. There is a tendency for both a photo-resist size and a processing conversion difference to become large with an increase in S as compared with FIG. 13(*a*) and FIG. 14(*a*). As a result, the last size in a line end is shown in FIG. 15(*a*). At this time, S in the case where the last size of a line end turns into a desired size was estimated at 0.2 micrometers.

On the other hand, it turns out that the amount of shortenings of the photo-resist in a line tip part becomes large with an increase in S as compared with FIG. 14(*b*). Contrary to this, the amount of shortenings tends to become small by etching from FIG. 13(*b*). The direction of the amount of shortening reduction by etching becomes small. The direction of FIG. 13(*b*) of this is because the inclination of the vertical axis is large from FIG. 14(*b*). As a result, the amount of shortenings after the last processing is shown in FIG. 15(*b*). It turns out that the amount of shortenings is set to 0 at S=0.8 micrometers.

In such a case, the value of S needs to be decided with the maximum permissible amount of shortenings of a pattern, and the allowable size of a line end. A relation with a different layer from the target layer is taken into consideration. It is judged whether a shortening is permissible.

An example of the factor for deciding the shortening maximum permissible amount of shortening is as follows: spatial relationship of a line tip part and a contact hole; possibility that a pattern will run aground on a diffusion layer with a shortening if a pattern is a gate.

An example of the factor which determines the allowable size of a line end is as follows: the margin which resolves a line end (processing process margins, such as lithography and etching); embedding to the space part between the patterns of a line end.

Generally, the value of S is decided from these viewpoints between S=0.2 micrometers (conditions from which a line end pattern size becomes predetermined), and S=0.8 micrometers (conditions from which the amount of shortenings is set to 0). The following reexamination needs to be made when it is judged that S, which satisfies conditions between them, does not exist. The reexamination of the process conditions including exposure conditions and OPC conditions improves the reexamination. It also is a further reexamination of a design rule or a design pattern layout. However, this will create a considerable amount of works Even if it is judged that the conditions are not attained, it is also possible to adjust a process so that the acceptable value of a shortening and the acceptable value of the size of a line end may be attained. It can be attained by considering these patterns as the point of management of the routine size in a factory.

The distance S which can permit the size of a line end and the quantity of a shortening by the above-mentioned technique is computed. Another pattern is arranged in the position. If required, adjustment of the routine dimensional control in a factory, process conditions, a layout, a design rule and OPC conditions will be performed for those parts. The result was obtained that the form of a line end could be stably formed on a wafer.

In this embodiment, in order to determine Distance S (distance between the end of the line of a pattern group and the pattern that counters the end of the line), the photo-resist size (photo-resist width), the amount of shortenings and etching conversion difference of the lithography process were used. Making a decision in consideration of the device characteristics (an electrical property and timing analysis) is also considered.

Thus, according to this embodiment, the end of the line which accomplishes a device pattern is extracted from the design data. The distance S of the extracted end and the pattern which counters is set at optimal. It can prevent pattern collapse and the pattern itself of a line end serve as a defect. Therefore, the process margin of lithography improves and the manufacture yield of a device improves.

In the above-mentioned embodiment, the end of the line which forms dummy patterns or device patterns was extracted. By extracting the end of a space, it is also possible to perform an arrangement of a share pattern and measurement of a photo-resist size and an etching size conversion difference.

This embodiment explained how to create a mask pattern. It is possible by forming a mask pattern on a mask board to manufacture a photo mask. The pattern of a semiconductor layer is formed in the photo-resist on a semiconductor board using this photo mask. As a result, a semiconductor device is manufactured.

Embodiment 5

In this embodiment, a layout example of the 1st wiring layers (M0) and the 2nd wiring layers (M1) will be explained.

Figure 17:
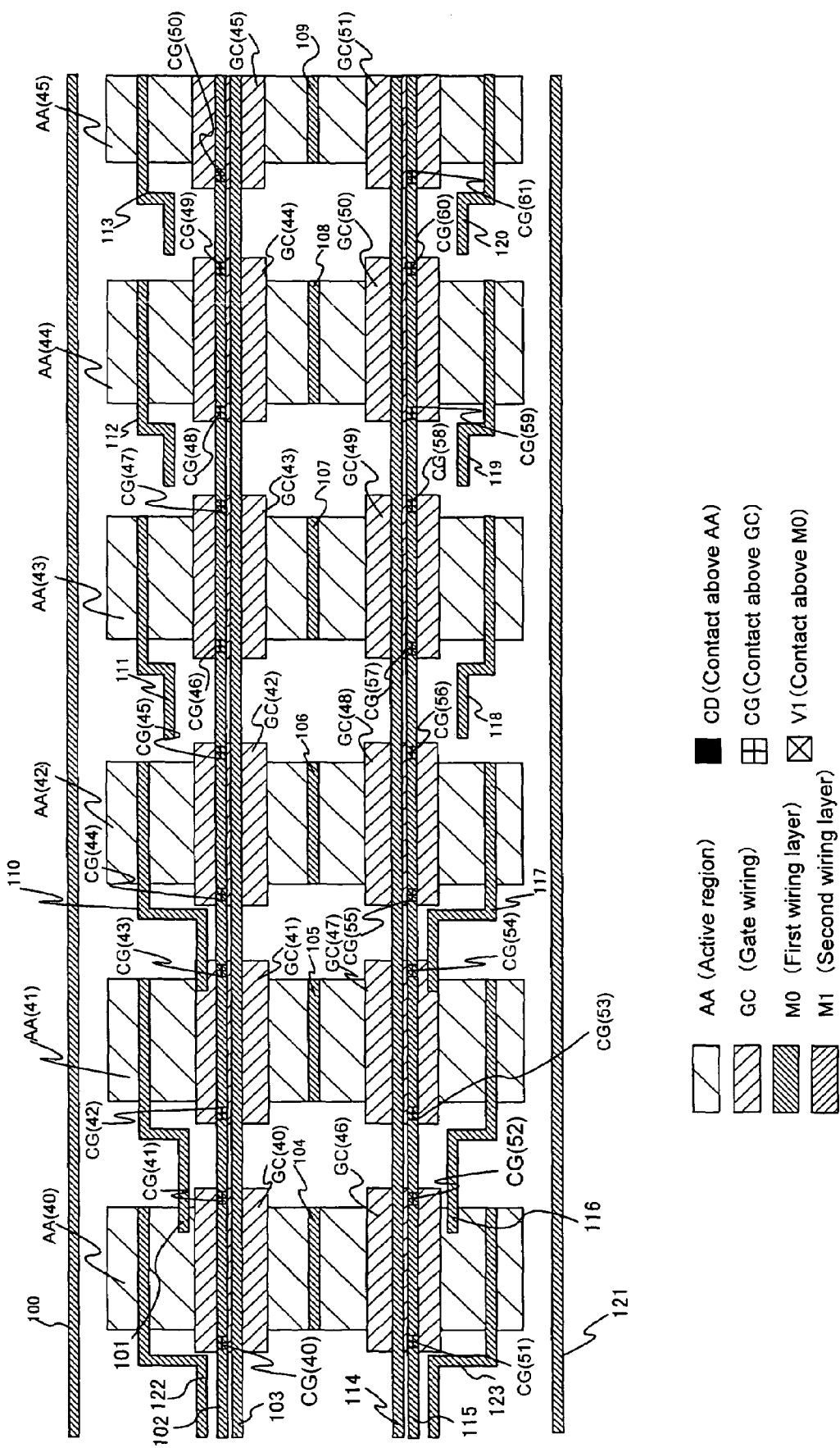
FIG. 17 is a schematic view of the layout of areas where the block decoders (Row decoders) of the NAND type flash memories of one embodiment and the word lines WL are connected through the 2nd wiring layers.
Figure 18:
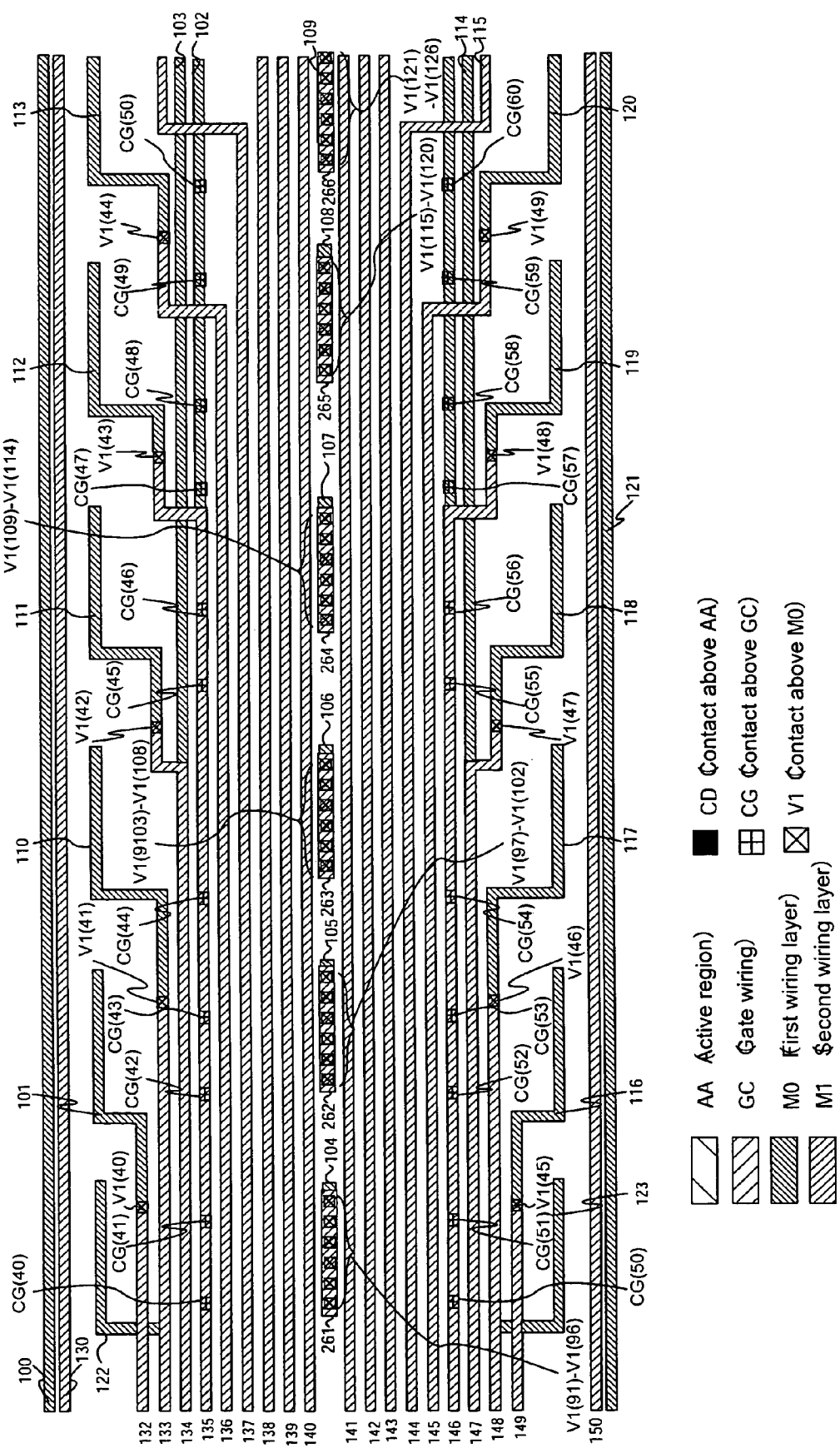
FIG. 18 is a schematic view of the layout of areas where the block decoders (Row decoders) of the NAND type flash memories of one embodiment and the word lines WL are connected through the 2nd wiring layers.

First, by referring FIGS. 17 and 18, a layout example of areas where the block decoders (row decoders) of the NAND type flash memories of this embodiment and the word lines WL are connected through the 2nd wiring layers M1 is explained FIG. 17 is a layout arrangement of the active regions (AA) AA (40)-AA(45), the gate wirings (GC) GC (40)-GC (51) and the 1st wiring layers (M0) 100-124. FIG. 18 is a layout arrangement of the 1st wiring layers (M0) 100-124 in the same region as the region shown in FIG. 17 and the 2nd wiring layers (M1) 130, 132-150, and 261-266. CG (40)-CG (61) are contacts which connect the gate wirings (GC) and the 1st wiring layers M0. V1 (40)-V1 (49) and V1 (91)-V1(126) are contacts which connect the 1st wiring layers (M0) and the 2nd wiring layers (M1). In FIGS. 17 and 18, the transfer transistors connected to the word lines WL26<0>/<1>, WL2<0>/<1>, WL1<0>/<1>, WL0<0>/<1>, WL27<0>/<1> and WL28<0>/<1> from the left side. The word lines WL except for WL26<0>/<1> in FIG. 17 and FIG. 18 are connected through the 2nd wiring layers M1.

As seen from FIGS. 17 and 18, the 1st wiring layers (M0) 100-124 and the 2nd wiring layers (M1) 130, 132-150, and 261-266 are designed to become almost straight patterns. The word lines WL0<0>/<1>-WL7<0>/<1> and WL27<0>/<1>-WL31<0>/<1> are extended only by the 1st wiring layers and the word line WL8<0>/<1>-WL26<0>/<1>, on the other hand, by both the 1st and 2nd wiring layers. This is based on the number of word lines extended only by the 1st wiring layers as much as possible. That results in a less number and the wider L/S of the 2nd wiring layers in a NAND string pitch.

Figure 19:
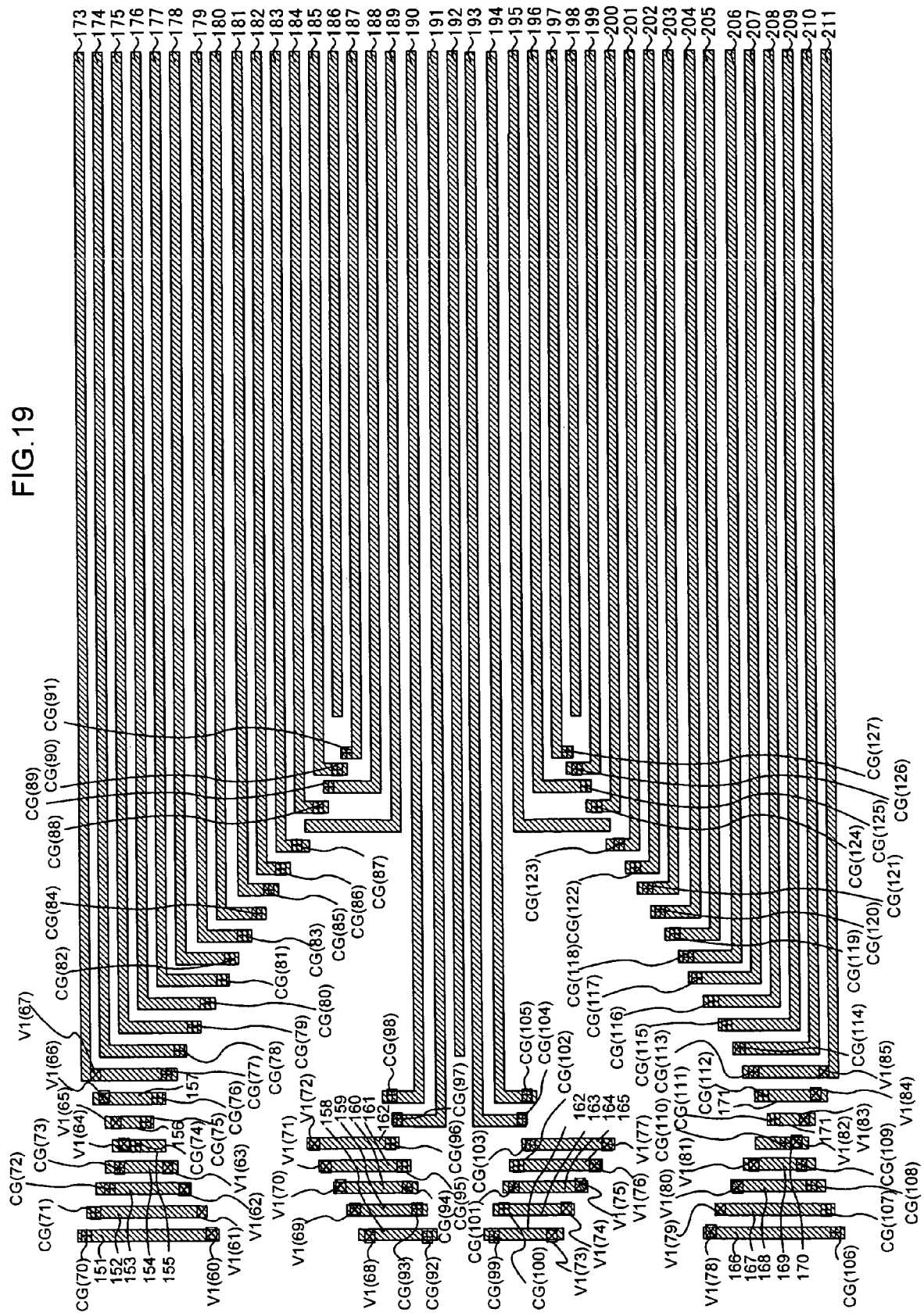
FIG. 19 is a schematic view of the layout of the transfer circuit in the block decoder of the NAND type flash memory of one embodiment of this invention.
Figure 20:
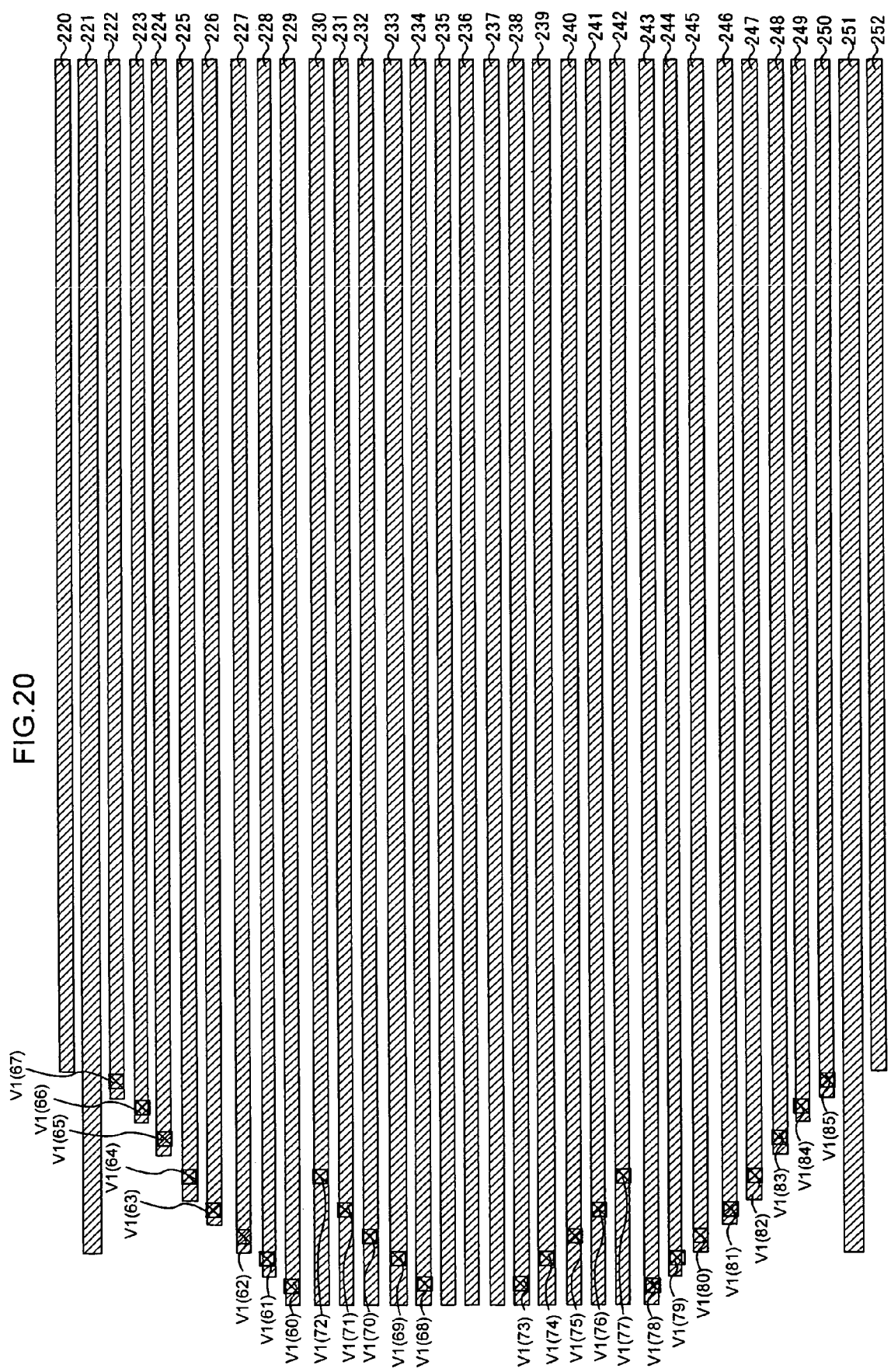
FIG. 20 is a schematic view of the layout of the transfer circuit in the block decoder of the NAND type flash memory of one embodiment of this invention.

Next, FIGS. 19 and 20 are referred to. FIGS. 19 and 20 are layout arrangements of the 1st wiring layers (M0) 151-211 and the 2nd wiring layers (M1) 220-252 in areas which the transfer transistors (transistors which transmit voltage to the word lines WL) in the block decoders (row decoders) of the NAND type flash memories of this embodiment. Also in FIGS. 19 and 20, CG (70)-CG (125) are contacts which connect the gate wirings (GC) and the 1st wiring layers M0. Moreover, V1 (60)-V1 (85) are contacts which connect the 1st wiring layers (M0) and the 2nd wiring layers (M1).

As seen from FIGS. 19 and 20, the 1st wiring layers (M0) 151-211 and the 2nd wiring layers (M1) 220-252 are designed to become almost straight.

What are claimed are:

1. A semiconductor memory device comprising:
a memory cell array arranged with a plurality of memory cells provided in a memory cell array region;
a plurality of bit lines comprised from a first wiring layer, said plurality of bit lines being arranged in parallel in a row direction and extending in a column direction from within said memory cell array region to the outside of said memory cell array region; and
a column decoder comprised from a plurality of high voltage transistors which supply a voltage to said plurality of bit lines, said plurality of high voltage transistors being arranged in parallel in said column direction and said column decoder being arranged in a column decoder region which is outside of said memory cell array region;
wherein
said plurality of bit lines extending from said memory cell array region to said column decoder region and formed by using only a substantially straight pattern which has no bending corners.

2. The semiconductor memory device according to claim 1, wherein said plurality of bit lines do not cut or break off, and all lengths of said plurality of bit lines are set equally.

3. The semiconductor memory device according to claim 1, wherein end parts of said plurality of bit lines are uniformed.

4. The semiconductor memory device according to claim 1, wherein said plurality of bit lines cut or break off partially in a region in which said plurality of high voltage transistors is arranged.

5. The semiconductor memory device according to claim 1, wherein a dummy pattern is formed of said first wiring layer with a certain distance from an end part of said plurality of bit lines.

6. The semiconductor memory device according to claim 5, wherein said dummy pattern in said first wiring layer is formed between said high voltage transistor region and a sense amplifier region.

7. The semiconductor memory device according to claim 1, wherein said column decoder has a sense amplifier region and a high voltage transistor region in which said plurality of high voltage transistors is arranged;
said plurality of bit lines extending to said column decoder are formed of said first wiring layer in which said high voltage transistor region and said sense amplifier region have different wiring widths respectively;

said first wiring layer formed in said high voltage transistor region and said first wiring layer formed in said sense amplifier region are connected through a second wiring layer formed under said first wiring layer.

8. The semiconductor memory device according to claim 1, wherein a plurality of connection parts which electrically connect said plurality of bit lines extending to said column decoder region with a source or drain of said plurality of high voltage transistors, said plurality of connection parts being arranged in parallel in said column direction according to an arrangement of said plurality of high voltage transistors.

9. The semiconductor memory device according to claim 8, comprising a second wiring layer formed under said first wiring layer so as to bend in step-wise, said first wiring layer electrically connects said plurality of bit lines with said plurality of connection parts, said second wiring layer set with a connection sequence to connect said plurality of bit lines with said plurality of connection parts.

* * * * *